United States Patent
Lee et al.

(10) Patent No.: US 12,493,246 B2
(45) Date of Patent: Dec. 9, 2025

(54) OVERLAY MEASUREMENT METHOD, SEMICONDUCTOR DEVICE MANUFACTURING METHOD USING THE SAME, AND OVERLAY MEASUREMENT APPARATUS

(71) Applicant: Samsung Electronics Co., Ltd., Suwon-si (KR)

(72) Inventors: Jaeil Lee, Hwaseong-si (KR); Kyoungcho Na, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 747 days.

(21) Appl. No.: 17/658,527

(22) Filed: Apr. 8, 2022

(65) Prior Publication Data
US 2023/0074537 A1 Mar. 9, 2023

(30) Foreign Application Priority Data
Aug. 23, 2021 (KR) .......................... 10-2021-0111201

(51) Int. Cl.
*G03F 7/00* (2006.01)
*H01L 21/66* (2006.01)

(52) U.S. Cl.
CPC ...... *G03F 7/70633* (2013.01); *G03F 7/70683* (2013.01); *H01L 22/12* (2013.01)

(58) Field of Classification Search
CPC ............ G03F 7/70633; G03F 7/70683; G03F 7/7045; G03F 7/706835; G03F 7/706845; G03F 9/7019; G03F 9/7076; G03F 9/708; G03F 9/7088; H01L 22/12; H01L 21/68; H01L 2223/54426; H01L 23/544
See application file for complete search history.

(56) References Cited

U.S. PATENT DOCUMENTS

| | | | |
|---|---|---|---|
| 7,068,833 B1 | 6/2006 | Ghinovker et al. | |
| 7,177,457 B2 | 2/2007 | Adel et al. | |
| 7,274,814 B2 | 9/2007 | Ghinovker et al. | |
| 7,317,824 B2 | 1/2008 | Ghinovker et al. | |
| 7,879,627 B2 | 2/2011 | Ghinovker et al. | |
| 9,786,569 B1 * | 10/2017 | Ho | H01L 22/20 |

(Continued)

FOREIGN PATENT DOCUMENTS

| | | |
|---|---|---|
| JP | 2020123700 A | 8/2020 |
| TW | 202125110 A | 7/2021 |
| WO | WO 2021/047841 A1 | 3/2021 |

*Primary Examiner* — Stewart A Fraser
(74) *Attorney, Agent, or Firm* — Wolf, Greenfield & Sacks, P.C.

(57) ABSTRACT

An overlay measurement method for accurately measuring and correcting an overlay in an environment in which a deep ultraviolet (DUV) apparatus and an extreme ultraviolet (EUV) apparatus are used together, a semiconductor device manufacturing method using the overlay measurement method, and an overlay measurement apparatus are provided. The overlay measurement method includes performing an absolute measurement of a position of an overlay mark of at least one of a plurality of layers, based on a fixed position, wherein an exposure process is performed on a first layer of the plurality of layers by using the DUV apparatus, and an exposure process is performed on an nth layer of the plurality of layers, which is an uppermost layer of the plurality of layers, by using the EUV apparatus.

20 Claims, 20 Drawing Sheets

(56) References Cited

U.S. PATENT DOCUMENTS

| | | |
|---|---|---|
| 10,809,624 B2 | 10/2020 | Lee et al. |
| 10,990,023 B1 | 4/2021 | Hsieh et al. |
| 10,996,573 B2 | 5/2021 | Ten Berge et al. |
| 2006/0066855 A1 | 3/2006 | Boef et al. |
| 2013/0100427 A1 | 4/2013 | Koolen et al. |
| 2020/0124975 A1* | 4/2020 | Lee ................. H05G 2/008 |
| 2021/0011373 A1 | 1/2021 | Lee et al. |
| 2022/0214624 A1* | 7/2022 | Lee ................. G03F 9/7088 |
| 2022/0334503 A1 | 10/2022 | Cui et al. |

* cited by examiner

OVERLAY MEASUREMENT METHOD, SEMICONDUCTOR DEVICE MANUFACTURING METHOD USING THE SAME, AND OVERLAY MEASUREMENT APPARATUS

CROSS-REFERENCE TO RELATED APPLICATION

This application is based on and claims priority under 35 U.S.C. § 119 to Korean Patent Application No. 10-2021-0111201, filed on Aug. 23, 2021, in the Korean Intellectual Property Office, the disclosure of which is incorporated by reference herein in its entirety.

BACKGROUND

The inventive concept relates to an overlay measurement method and an overlay measurement apparatus, and more particularly, to a measurement method and a measurement apparatus for measuring and correcting an overlay in an environment in which deep ultraviolet (DUV) equipment and extreme ultraviolet (EUV) equipment are used together.

Line widths in semiconductor circuits have become finer, and accordingly, the formation of layers by using EUV equipment has increased. For example, patterns of a plurality of layers are formed in one chip by combining a DUV with a EUV machine. The DUV machine and the EUV machine may differ from each other in terms of a wafer stage, a reticle, a slit, an optical system, etc. In addition the DUV machine and the EUV machine use light sources of different wavelengths. When the DUV machine and the EUV machine are used in combination with each other, due to the differences therebetween, an overlay misalignment may occur when a fine pattern is formed. Generally, an overlay according to the combination of the DUV machine and the EUV machine is referred to as a matched machine overlay (MMO).

SUMMARY

The inventive concept provides an overlay measurement method for accurately measuring and correcting an overlay in an environment in which deep ultraviolet (DUV) equipment and extreme ultraviolet (EUV) equipment are used together, and a method of manufacturing a semiconductor device, which uses the overlay measurement method, and an overlay measurement apparatus.

Also, embodiments of the inventive concept are not limited to those mentioned above, and other objectives will be clearly understood by one of ordinary skill in the art from the descriptions below.

According to an aspect of the inventive concept, there is provided an overlay measurement method including performing an absolute measurement of a position of an overlay mark of at least one of a plurality of layers, based on a fixed position, wherein an exposure process is performed on a first layer of the plurality of layers by using a deep ultraviolet (DUV) apparatus, and wherein an exposure process is performed on an nth layer, which is an uppermost layer of the plurality of layers, by using an extreme ultraviolet (EUV) apparatus.

According to another aspect of the inventive concept, there is provided an overlay measurement method including performing, based on a fixed position, an absolute measurement of a position of a first overlay mark, which is formed on a first layer of a plurality of layers on a first semiconductor substrate by using a deep ultraviolet (DUV) apparatus, first-feeding a result of the absolute measurement the position of the first overlay mark back to the DUV apparatus, performing an absolute measurement of a position of a second overlay mark, which is formed on an nth layer of the plurality of layers, which is an uppermost layer on the first semiconductor substrate, by using an extreme ultraviolet (EUV) apparatus, and second-feeding a result of the absolute measurement of the position of the second overlay mark to the DUV apparatus.

According to another aspect of the inventive concept, there is provided a method of manufacturing a semiconductor device, the method including forming a first overlay mark on a first layer of a plurality of layers on a first semiconductor substrate by using a deep ultraviolet (DUV) apparatus, performing an absolute measurement of a position of the first overlay mark, based on a fixed position, first-feeding a result of the absolute measurement of the position of the first overlay mark to the DUV apparatus, forming a second overlay mark on an nth layer of the plurality of layers, which is the uppermost layer on the first semiconductor substrate, by using an extreme ultraviolet (EUV) apparatus, performing an absolute measurement of a position of the second overlay mark, and second-feeding a result of the absolute measurement of the position of the second overlay mark back to the DUV apparatus.

According to another aspect of the inventive concept, there is provided an overlay measurement apparatus including a first measurement device configured to perform a relative measurement of a position of an overlay mark of at least one of a plurality of layers, a second measurement device configured to perform an absolute measurement of a position of an overlay mark of at least one of the plurality of layers, based on a fixed position, and a calculation device configured to calculate an overlay based on a result of the absolute measurement, wherein an exposure process is performed on a first layer of the plurality of layers by using a deep ultraviolet (DUV) apparatus, and wherein an exposure process is performed on an nth layer of the plurality of layers, which is the uppermost layer of the plurality of layers by using an extreme ultraviolet (EUV) apparatus.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
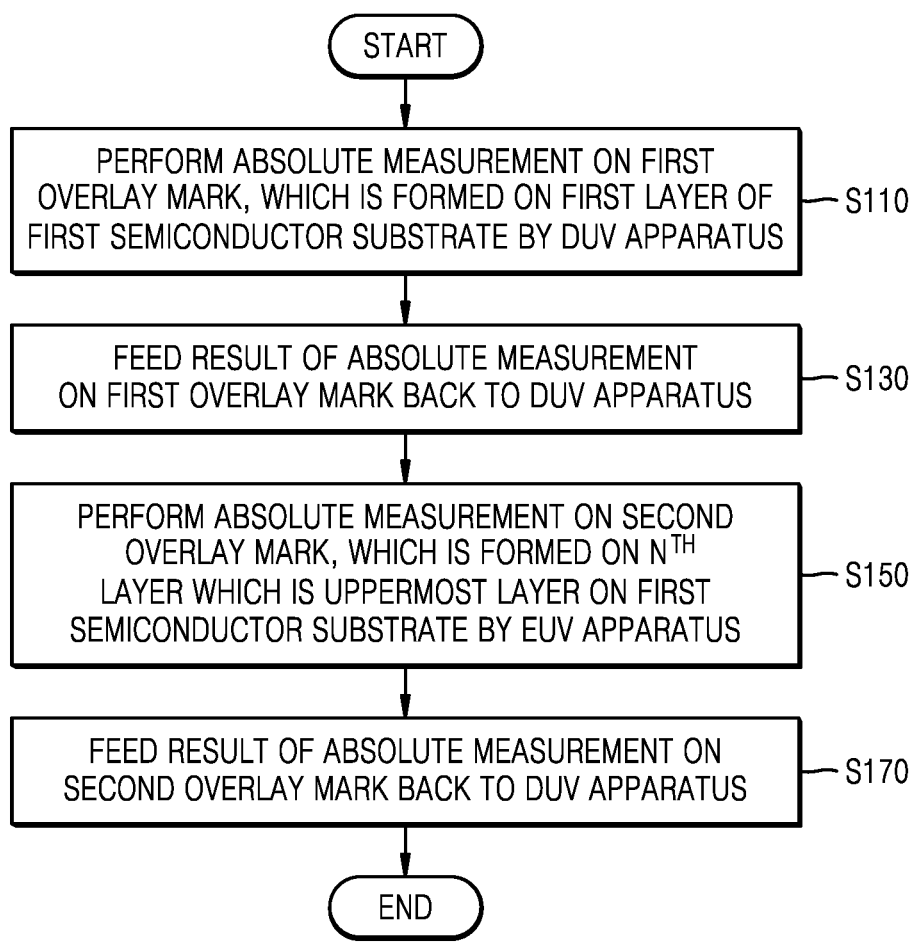
FIG. 1 is a schematic flowchart of an overlay measurement method according to an embodiment of the inventive concept.

Hereinafter, embodiments of the inventive concept are described in detail with reference to the accompanying drawings. For the same components on the drawings, the same reference numerals are used, and the same descriptions are not given. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2A:
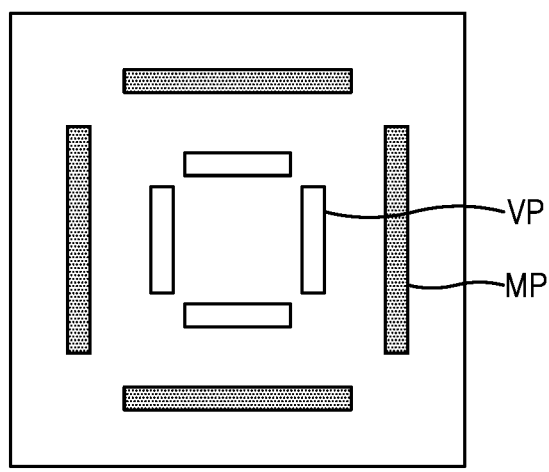
FIGS. 2A and 2B are plan views of an image based overlay (IBO) mark used in the overlay measurement method of FIG. 1.
Figure 2B:
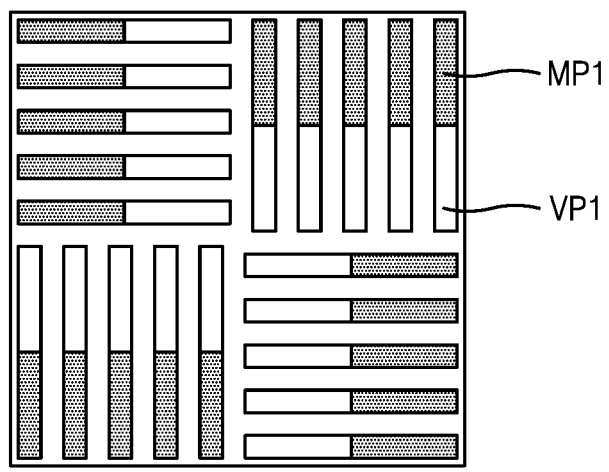
Figure 3A:
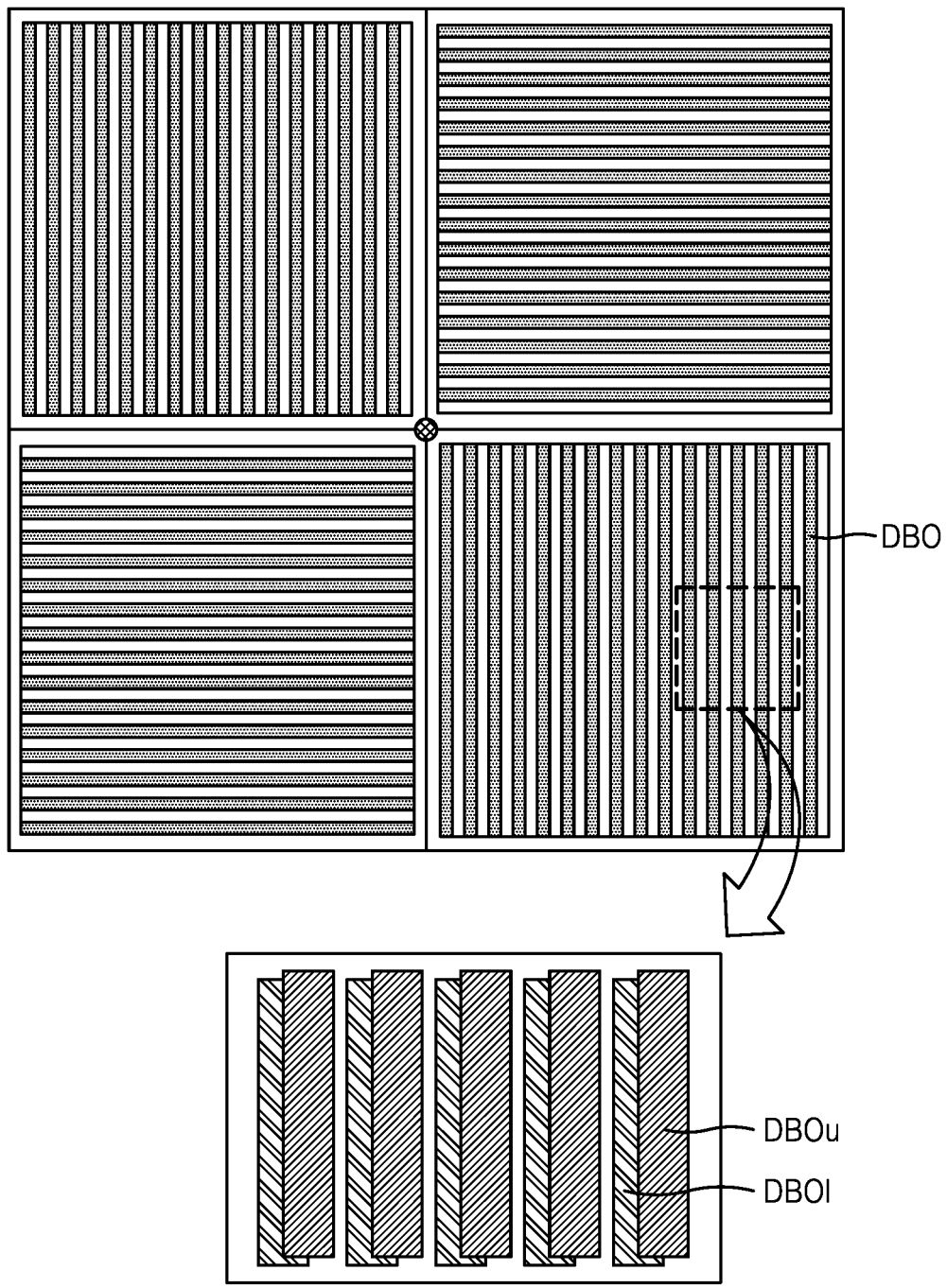
FIGS. 3A and 3B are a plan view and a cross-sectional view, respectively, of a diffraction based overlay (DBO) mark used in the overlay measurement method of FIG. 1.
Figure 3B:
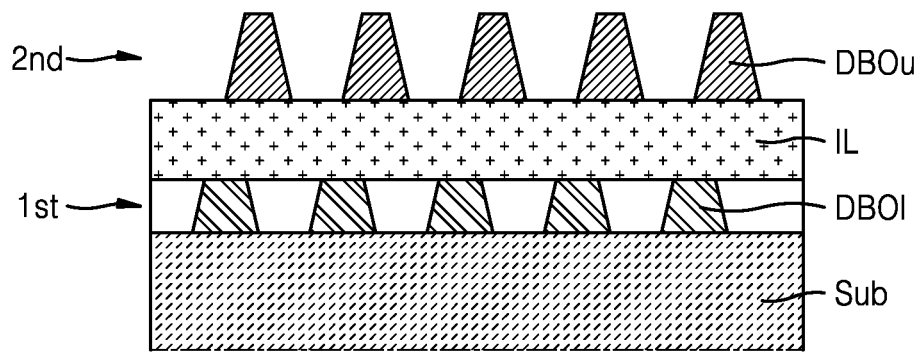
Figure 5A:
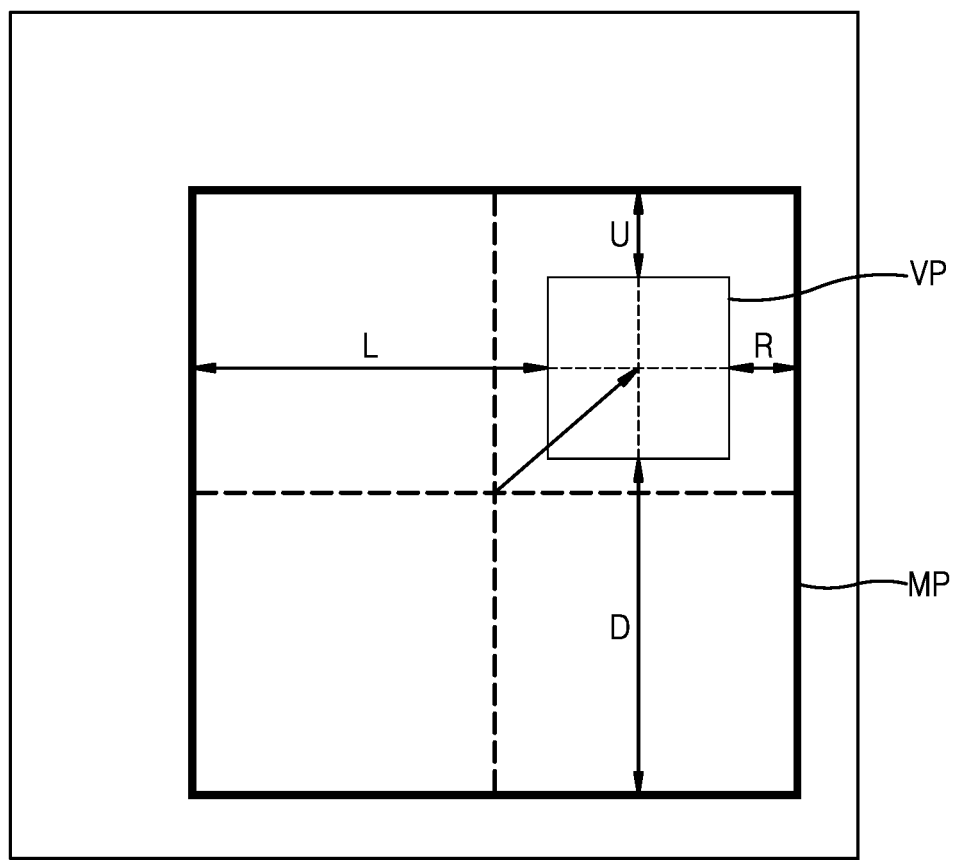
FIGS. 5A and 5B are conceptual diagrams that illustrate the concepts of a relative measurement and an absolute measurement used in the overlay measurement method of FIG. 1.
Figure 5B:
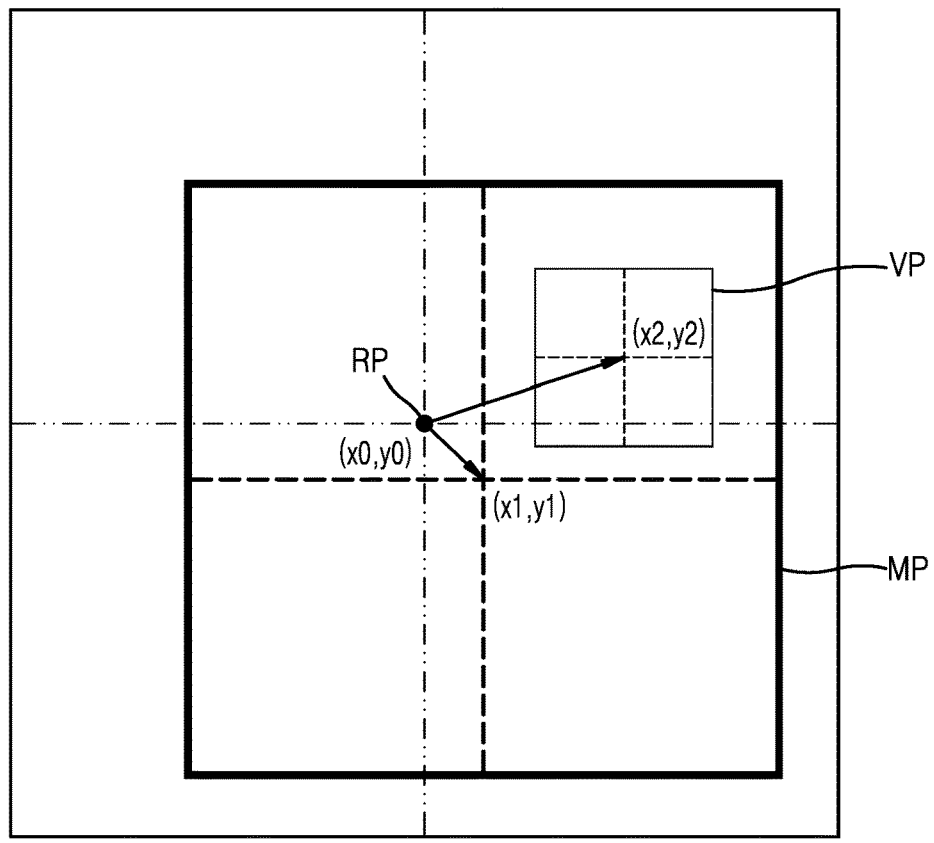
Figure 6A:
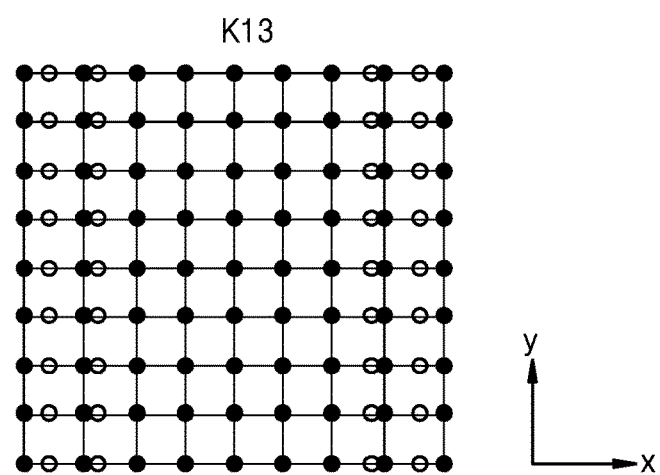
FIGS. 6A and 6B include conceptual diagrams that illustrate a K13 component from among components of an overlay according to an embodiment of the inventive concept.
Figure 6B:
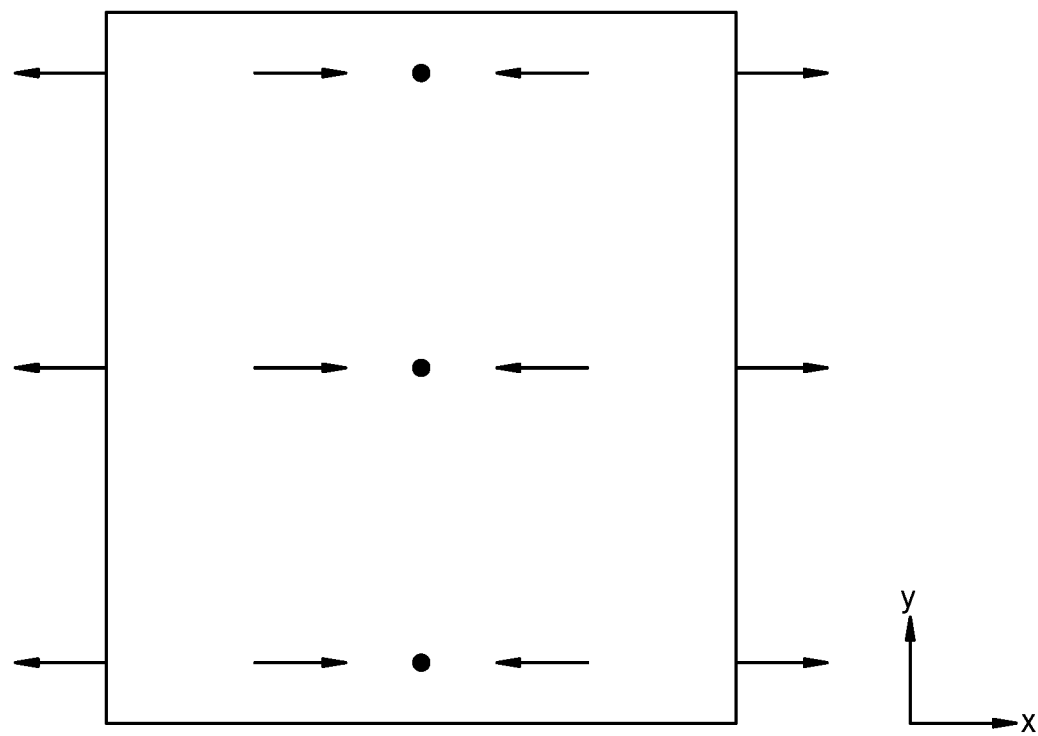
Figure 6B:
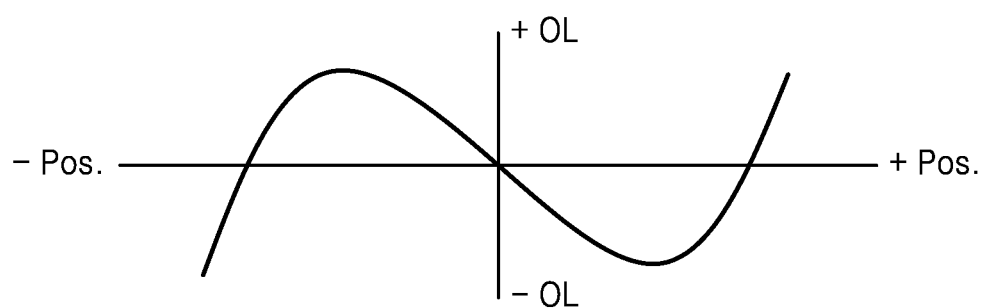

FIG. 1 is a schematic flowchart of an overlay measurement method according to an embodiment of the inventive concept. FIGS. 2A and 2B are plan views of an image based overlay (IBO) mark used in the overlay measurement method of FIG. 1, FIGS. 3A and 3B are, respectively a plan view and a cross-sectional view of a diffraction based overlay (DBO) mark used in the overlay measurement method of FIG. 1, and FIGS. 4A through 4C are cross-sectional views illustrating an embodiment of measuring an overlay by using the DBO mark of FIG. 3A. FIGS. 5A and 5B are conceptual diagrams that illustrate concepts of a relative measurement and an absolute measurement used in the overlay measurement method of FIG. 1. FIG. 6 illustrates conceptual diagrams that illustrate a K13 component from among components of an overlay according to embodiments of the inventive concept.

Referring to FIG. 1, an overlay measurement method, according to an embodiment of the inventive concept, is illustrated. First, an absolute measurement may be performed to determine a position of a first overlay mark, which is formed on a first layer on a first semiconductor substrate by using a deep ultraviolet (DUV) machine (S110). An overlay mark may refer to a mark for measuring an overlay. An overlay may be defined in relation to correspondence between a wafer or a semiconductor substrate and a shape of a shot of a current step in fabrication or modification of a wafer or a semiconductor substrate and a shape of a shot of a previous step. For example, an overlay may denote a concept for preventing or reducing misalignment between two layers, in a case where an exposure process is performed on a first layer of a semiconductor substrate, and the exposure process is performed again on a next layer after one or more processing operations. A relative position control between layers may be referred to as an overlay control, and an overlay measurement may be performed for the overlay control. The overlay measurement may denote the measurement of a degree of misalignment between layers, that is, an overlay misalignment or an overlay error. Hereinafter, for convenience, the "overlay error" will be commonly referred to as the "overlay."

An overlay mark and the overlay measurement will be described in detail by referring to FIGS. 2A through 4C. FIGS. 2A and 2B illustrate the IBO mark. The IBO mark may include a main pattern MP formed on a lower layer and a Vernier pattern VP formed on a current layer. The main pattern MP and the Vernier pattern VP may also be referred to as an outer pattern and an inner pattern, respectively, based on positions of the patterns. In the IBO mark, an overlay may be measured by performing signal processing on an optical/camera image with respect to the IBO mark. For example, the signal processing may be performed on the image of the main pattern MP and the Vernier pattern VP, and a relative position between the main pattern MP and the Vernier pattern VP may be calculated, to measure the overlay.

FIG. 2A illustrates a box in box (BIB) overlay mark according to an embodiment of the inventive concept. The outer large square may be the main pattern MP formed on the lower layer, and the inner small square may be the Vernier pattern VP formed on the current layer. FIG. 2B illustrates an advanced image metrology (AIM) overlay mark. The outer dark patterns may be a main pattern MP1 formed on a lower layer, and the inner bright patterns may be a Vernier pattern VP1 formed on a current layer.

FIGS. 3A and 3B illustrate a DBO mark according to an embodiment of the inventive concept. As shown in the cross-sectional view of FIG. 3B, in the case of the DBO mark, a lower layer and an upper layer may have the same patterns formed at the same positions. For example, as illustrated in the enlarged view of FIG. 3A and the cross-sectional view of FIG. 3B, the DBO mark may include a lower pattern DBOl and an upper pattern DBOu. For example, in FIG. 3B, the lower pattern DBOl may be formed on a first layer 1st on a semiconductor substrate sub, and the upper pattern DBOu may be formed on a second layer 2nd on an interlayer insulating layer IL. In the DBO mark, light that is incident into the DBO mark and diffracted may be detected and the diffracted light may be signal-processed to measure an overlay. For example, a reflected and diffracted signal from the DBO mark may be detected and intensities of 1st-order components of the diffracted signal may be compared to measure the overlay.

Figure 4A:
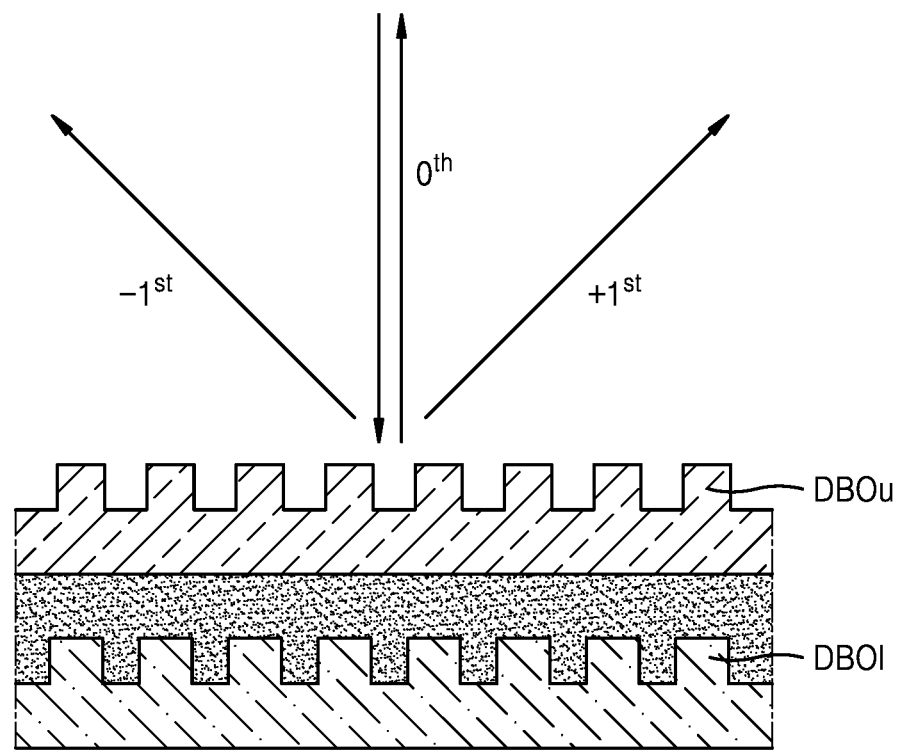
FIGS. 4A through 4C are cross-sectional views illustrating embodiments for measuring an overlay by using the DBO mark of FIG. 3A.
Figure 4B:
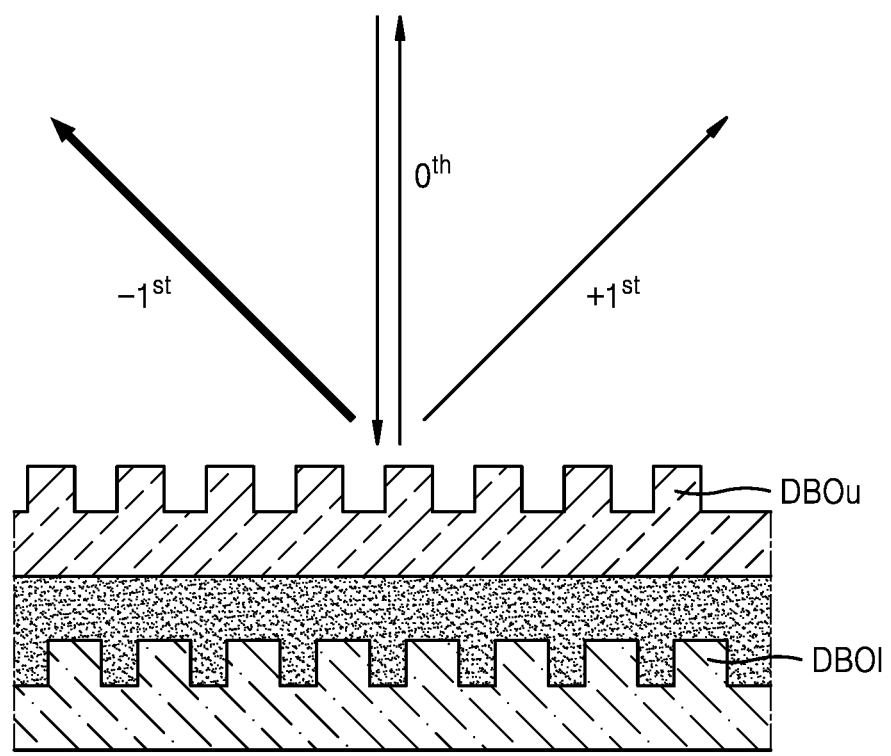
Figure 4C:
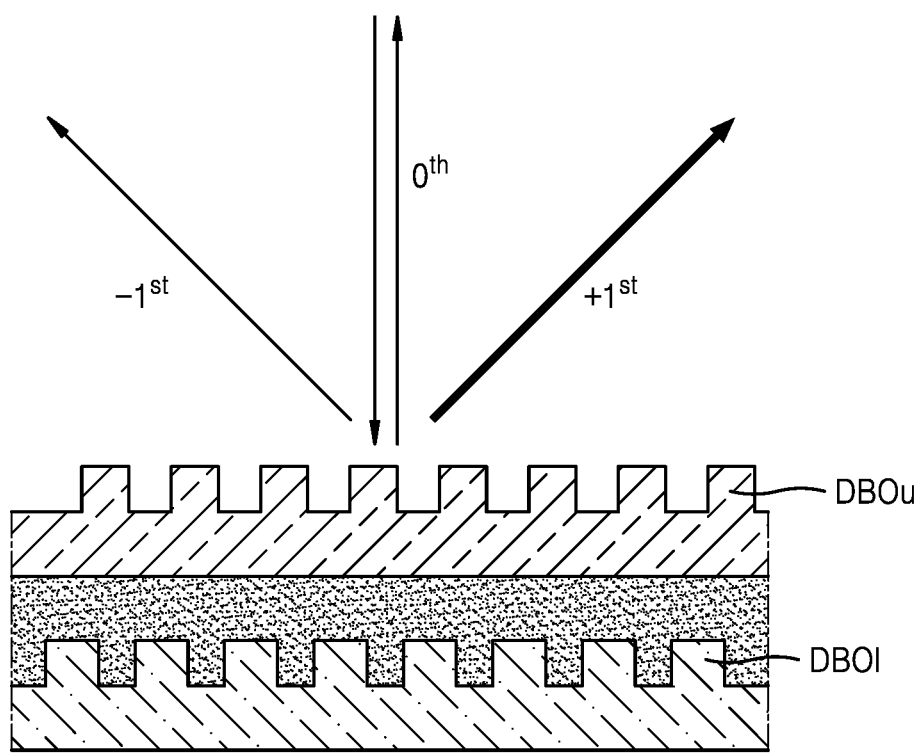

A more detailed description will be provided with reference to FIGS. 4A through 4C. As illustrated in FIG. 4A, when the lower pattern DBOl and the upper pattern DBOu completely correspond to each other, intensities of a (−) 1st-order component and a (+) 1st-order component of the diffracted signal may be substantially the same as each other. Thus, it may be determined that there is no overlay misalignment. As illustrated in FIG. 4B or 4C, when the lower pattern DBOl and the upper pattern DBOu do not correspond to each other, the intensity of the (−) 1st-order component of the diffracted signal may be greater than the intensity of the (+) 1st-order component, or the intensity of the (+) 1st-order component may be greater than the intensity of the (−) 1st-order component. Thus, it may be determined that there is an overlay misalignment.

In addition, an overlay mark may be formed together when a device pattern is formed on the same layer. It may be determined whether a device pattern is aligned with a device pattern of a lower layer by measuring the overlay by using the overlay mark. Hereinafter, the meaning of "forming an overlay mark" may mean "forming a device pattern on the same layer."

An absolute measurement may denote the measurement based on a fixed position. Here, the fixed position may not be changed in an exposure process by a DUV apparatus and/or an EUV apparatus and may correspond to an origin of an absolute coordinate. For example, the fixed position may be a reference position on a wafer stage, separately from a semiconductor substrate on which an overlay mark is formed. A relative measurement is opposite of the absolute measurement and may denote the measurement based on a selected position. The selected position may be changed in the exposure process by the DUV apparatus and the EUV apparatus. For example, the selected position may be an arbitrary point on the semiconductor substrate on which the overlay mark is formed. That is, the relative measurement may denote the measurement of only a relative position between the selected position and a measurement position.

The absolute measurement and the relative measurement will be described in more detail with reference to FIGS. 5A and 5B. FIG. 5A illustrates a relative measurement using a BIB mark. In the relative measurement, only a relative position between the main pattern MP and the Vernier pattern VP may be measured, and thus, there is no reference position. In relation to the above description with respect to the relative measurement, the center of the main pattern MP may correspond to the selected position, and the center of the Vernier pattern VP may correspond to the measurement position. Because there is no reference position, the wafer stage on which the corresponding semiconductor substrate is arranged may not need a high precision with respect to position. For reference, in FIG. 5A, an overlay in an x direction may be indicated as Xol=(L−R)/2, and an overlay in a y direction may be indicated as Yol=(U−D)/2.

FIG. 5B illustrates an absolute measurement using a BIB mark. In the absolute measurement, a position of each of the main pattern MP and the Vernier pattern VP may be measured based on a reference position RP. Here, the reference position RP may be an absolute position regardless of a semiconductor substrate on which the BIB mark is formed and may be a position on a wafer stage. In FIG. 5B, the reference position RP is indicated by the black point, and in relation to the above description with respect to the absolute measurement, the black point may correspond to the fixed position. Because the reference position RP is required in the absolute measurement, the wafer stage on which the corresponding semiconductor substrate is arranged may need a high precision with respect to position. For reference, in FIG. 5B, an overlay in an x direction may be indicated as Xol=(an x coordinate (x2) of the Vernier pattern−a reference position (x0) of an x axis)−(an x coordinate (x1) of the main pattern−the reference position (x0) of the x axis), and an overlay in a y direction may be indicated as Yol=(a y coordinate (y2) of the Vernier pattern−a reference position (y0) of a y axis)−(a y coordinate (y1) of the main pattern−the reference position (y0) of the y axis).

In addition, in the case of the absolute measurement, the measurement may be performed on one layer. For example, in the case of the BIB mark, an absolute measurement may be performed on the main pattern of the lower layer, and an absolute measurement may be performed on the Vernier pattern of the upper layer. In this manner, the absolute measurement may be performed on an each layer and each overlay mark. Also in the case of the DBO mark, an absolute measurement may be performed on the lower pattern DBOl of the lower layer, and an absolute measurement may be performed on the upper pattern DBOu of the upper layer. The absolute measurement, as such, may be performed by detecting a signal with respect to a corresponding pattern and calculating a position by processing the signal.

In the performing of the absolute measurement on the first overlay mark (S110), an overlay of the first overlay mark of the first layer of the first semiconductor substrate may be accurately measured based on the absolute measurement. For reference, there may be various components in the overlay. For example, the overlay may include a zero-order component, a 1st-order linear component, and a 2nd-order or greater non-linear component, and there may be a wafer component WK or an inter-field component and a shot component RK or an intra-field component.

In detail, the zero-order component may include a K1 component and a K2 component. The K1 component may denote an overlay component generated one-sidedly in an x direction as a constant size, and the K2 component may denote an overlay component generated one-sidedly in a y direction as a constant size. When an overlay in the x direction is indicated as dx, and an overlay in the y direction is indicated as dy, the K1 component may be indicated as dx=k1, and the K2 component may be indicated as dy=k2. Here, the y direction may correspond to a scan direction in an exposure process, and the x direction may be a direction perpendicular to the y direction. The x direction may correspond to a direction in which a slit extends. The zero-order component may be included in a linear component.

The 1st-order linear component may include K3 through K6 components. The K3 component may denote an overlay component generated two-sidedly in the x direction as a size proportionate to a position, and the K4 component may denote an overlay component generated two-sidedly in the y direction as a size proportionate to a position. The K5 and K6 components are overlay components generated in a vertical direction as a size proportionate to a position. The K3 component may be indicated as dx=k3*x, and the K4 component may be indicated as dy=k4*y. Also, the K5 component may be indicated as dx=k5*y, and the K6 component may be indicated as dy=k6*x.

The 2nd-order or greater non-linear component may include K7 through K20 components. Also, a 2nd-order non-linear component may include K7 through K12 components. The K7 component may denote an overlay component generated two-sidedly in the x direction as a size proportionate to the square of the position, and the K8 component may denote an overlay component generated two-sidedly in the y direction as a size proportionate to the square of the position. Moreover, the K9 through K12 components may also be generated as a size proportionate to the square of the position. The K7 component may be indicated as dx=k7*$x^2$, and the K8 component may be indicated as dy=k8*$y^2$. Also, the K9 component may be indicated as dx=k9*x*y, the K10 component may be indicated as dy=k10*y*x, the K11 component may be indicated as dx=k11*$y^2$, and the K12 component may be indicated as dy=k12*$x^2$.

A 3rd-order non-linear component may include K13 through K20 components. The K13 component may denote an overlay component generated two-sidedly in the x direction as a size proportionate to the cube of the position, and the K14 component may denote an overlay component generated two-sidedly in the y direction as a size proportionate to the cube of the position. In addition, the K15 through K20 components may also be generated as a size proportionate to the cube of the position. The K13 component may be indicated as dx=k13*$x^3$, and the K14 component may be indicated as dy=k14*$y^3$. Also, the K15 component may be indicated as dx=k15*$x^2$*y, the K16 component may be indicated as dy=k16*$y^2$*x, the K17 component may be indicated as dx=k17*x*$y^2$, the K18 component may be indicated as dy=k18*y*$x^2$, the K19 component may be indicated as dx=k19*$y^3$, and the K20 component may be indicated as dy=k20*$x^3$.

In the DUV apparatus, all of the overlay components except for the K20 component may be corrected by a physical operation of a projection lens, a wafer stage, or a reticle stage. Also, similarly to the DUV apparatus, in the EUV apparatus, most of the overlay components may be corrected by the physical operation of the wafer stage or the reticle stage. However, unlike the DUV apparatus, in the EUV apparatus, the K13 component may not be corrected by the physical operation.

Aspects with respect to the K13 component will be described in more detail with reference to FIGS. 6A and 6B. FIG. 6A is a plan view in which a misalignment direction of the K13 component is indicated by an arrow, and the lower graph shown in FIG. 6B shows a size of the K13 component based on a position in an x direction, in correspondence to the upper figure. In the lower graph of FIG. 6B, an x axis indicates the position Pos., and a y axis indicates a size OL of an overlay. As illustrated in the lower graph of FIG. 6B, the K13 component may be generated two-sidedly in the x direction as a size proportionate to the cube of the position. The K13 component may be corrected through adjustment of a projection lens in the DUV apparatus, but may not be corrected in the EUV apparatus.

Also, in an environment in which the DUV apparatus and the EUV apparatus are used together, it still may not be possible to correct the K13 component. The reason that the K13 component may not be corrected in the environment in which the DUV apparatus and the EUV apparatus are used together may be due to a difference in an exposure environment between the apparatuses. For example, the DUV apparatus may include a DUV scanner using a wavelength equal to or greater than about 100 nm, for example, a wavelength of 193 nm, a wafer stage identifying a position by using an encoder, an optical system using a lens, and a slit having a linear shape and use a transmissive mask. However, the EUV apparatus may include a EUV scanner using a wavelength equal to or less than about 20 nm, for example, a wavelength of 13.5 nm, a wafer stage identifying a position by using an interferometer, an optical system using a mirror, and a slit having a curved shape and may use a reflective mask. Due to this difference between the apparatuses, it may be impossible to correct the K13 component caused by the mirror of the optical system of the EUV apparatus.

In the environment in which the DUV apparatus and the EUV apparatus are used together, the K13 component in an exposure process of the DUV apparatus may be removed or minimized to reduce or minimize the K13 component in a subsequent exposure process of the EUV apparatus. For example, when a lower layer is exposed by using the DUV apparatus, and an upper layer is exposed by using the EUV apparatus, to accurately analyze the K13 component caused by the mirror of the EUV apparatus, a high-order component of an overlay of the lower layer, in particular, a first layer, may be analyzed. In the case of an overlay mark of the first layer of the semiconductor substrate, the overlay may be calculated generally by using a stitch overlay method. However, according to the stitch overlay method, high-order components of the overlay including the K13 component may not be calculated, and only linear components of the overlay may be calculated. Thus, in the environment in which the DUV apparatus and the EUV apparatus are used together, it may be impossible to correct the K13 component caused by the mirror of the EUV apparatus. However, according to the overlay measurement method according to an embodiment of the inventive concept, an absolute measurement may be performed on the first overlay mark of the first layer of the first semiconductor substrate, and thus, the high-order components of the overlay, in particular, the K13 component may be accurately calculated and analyzed. Accordingly, it may be possible to calculate the amount of correction of the K13 component.

Further, referring to FIG. 1, a result of the absolute measurement performed on the first overlay mark may be fed back to the DUV apparatus (S130). In other words, the amount of correction of the high-order components of the overlay, in particular, the K13 component, obtained through the absolute measurement of the position of the first overlay mark, may be fed back to the DUV apparatus. Based on this feedback, an overlay input value of the DUV apparatus may be changed, and the K13 component in the subsequent exposure process of the DUV apparatus may be removed or minimized. Also, the K13 component in the exposure process of the EUV apparatus may also be reduced or minimized.

The performing of the absolute measurement on the first overlay mark (S110) and the feeding of the result of the absolute measurement back to the DUV apparatus (S130) may include performing a relative measurement on the first overlay mark and feeding a result of the relative measurement back to the DUV apparatus. The relative measurement on the first overlay mark may be performed by using the stitch overlay method, as described above.

Thereafter, an absolute measurement may be performed on a second overlay mark, which is formed on an nth layer that is the uppermost layer on the first semiconductor substrate by using the EUV apparatus (S150). In the performing of the absolute measurement on the second overlay mark (S150), a measurement method with respect to an overlay mark on an n−1th layer may be changed, according to the value of n of the nth layer. For example, when the nth layer is the second layer, the n−1th layer is the first layer, and thus, the description about the first overlay mark on the first layer may be applied. When the nth layer is a third or higher layer, the n−1th layer may be the second or higher layer, and thus, a corresponding absolute measurement may be performed on an overlay mark on the n−1th layer. An embodiment in which the nth layer is the second layer will be described with reference to FIGS. 7 through 8B, and an embodiment in which the nth layer is the third or higher layer will be described with reference to FIGS. 9 and 10.

Finally, a result of the absolute measurement of the position of the second overlay mark may be fed back to the DUV apparatus (S170). Also, the result of the absolute measurement of the position of the first overlay mark may also be fed back to the DUV apparatus. The performing of the absolute measurement on the second overlay mark (S130) and the feeding of the result of the absolute measurement back to the DUV apparatus (S150) may include performing a relative measurement on the second overlay mark and feeding a result of the relative measurement back to the EUV apparatus.

According to the overlay measurement method according to an embodiment of the inventive concept, in the environment in which the DUV apparatus and the EUV apparatus are used together, the absolute measurement may be performed on the first overlay mark, which is formed on the first layer of the first semiconductor substrate by using the DUV apparatus, and thus, the high-order components of the overlay, in particular, the K13 component, may be accurately calculated and analyzed, and a result of the calculation and the analysis may be fed back to the DUV apparatus. Thus, according to the overlay measurement method according to an embodiment of the inventive concept, the K13 component in the exposure process of the DUV apparatus may be removed, reduced, or minimized, and thus, the K13 component in the exposure process of the EUV apparatus may be reduced or minimized.

Figure 7:
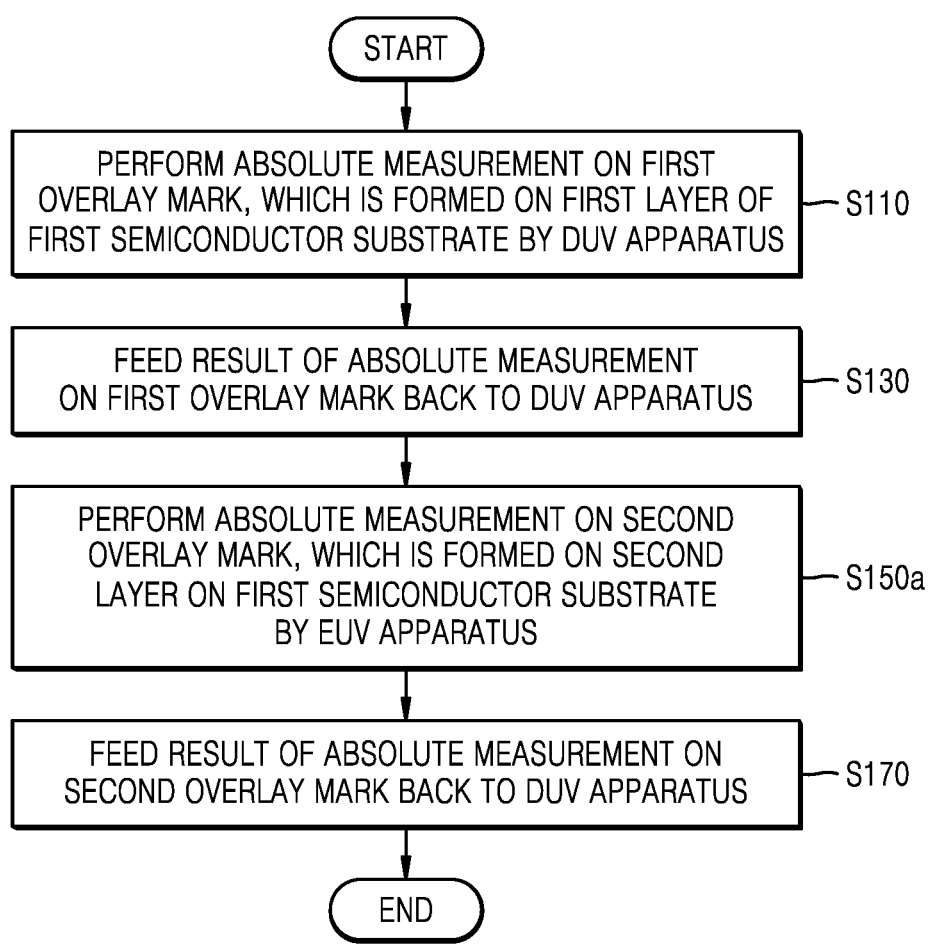
FIG. 7 is a schematic flowchart of an overlay measurement method according to an embodiment of the inventive concept in which two layers are provided on a semiconductor substrate, in the overlay measurement method of FIG. 1.

FIG. 7 is a schematic flowchart of an overlay measurement method according to an embodiment of the inventive concept in which two layers are provided on a semiconductor substrate and the overlay measurement method of FIG. 1 is used. The aspects described above with reference to FIGS. 1 through 6B will be briefly described or omitted.

Referring to FIG. 7, the overlay measurement method according to the present embodiment may correspond to an embodiment of the overlay measurement method of FIG. 1, in which n is 2, that is, the nth layer that is the uppermost layer is the second layer. In detail, the overlay measurement method according to the present embodiment may sequentially include performing the absolute measurement on the first overlay mark (S110) and feeding the result of the absolute measurement back to the DUV apparatus (S130).

Aspects with respect to the operations S110 and S130 are as described above with reference to FIG. 1.

Next, an absolute measurement may be performed on the second overlay mark, which is formed on the second layer of the first semiconductor substrate by using the EUV apparatus (S150a). Also, as described above, a relative measurement may be performed together on the second overlay mark.

Further, a result of the absolute measurement of the position of the second overlay mark may be fed back to the DUV apparatus (S170). Also, the result of the absolute measurement of the position of the first overlay mark may also be fed back to the DUV apparatus. Also, a result of the relative measurement of the position of the second overlay mark may be fed back to the EUV apparatus.

Thereafter, a first overlay mark may be formed on a first layer of a second semiconductor substrate by using the DUV apparatus, and a second overlay mark may be formed on a second layer of the second semiconductor substrate by using the EUV apparatus. Because the first overlay mark may be formed by the DUV apparatus having a changed overlay input value, the K13 component of the first overlay mark may be removed, reduced, or minimized. Also, because the K13 component of the first overlay mark may be removed, reduced, or minimized, the K13 component of the second overlay mark formed by the EUV apparatus may also be reduced or minimized. In the case of the EUV apparatus, an overlay input value may be changed based on the result of the relative measurement of the position of the second overlay mark.

Aspects will be described in more detail hereinafter with reference to FIGS. 8A and 8B, regarding embodiments in which the K13 component in the exposure process performed on the first layer using the DUV apparatus may be removed, reduced, or minimized based on the absolute measurement, and accordingly, the K13 component in the exposure process performed on the second layer using the EUV apparatus may be reduced or minimized.

Figure 8A:
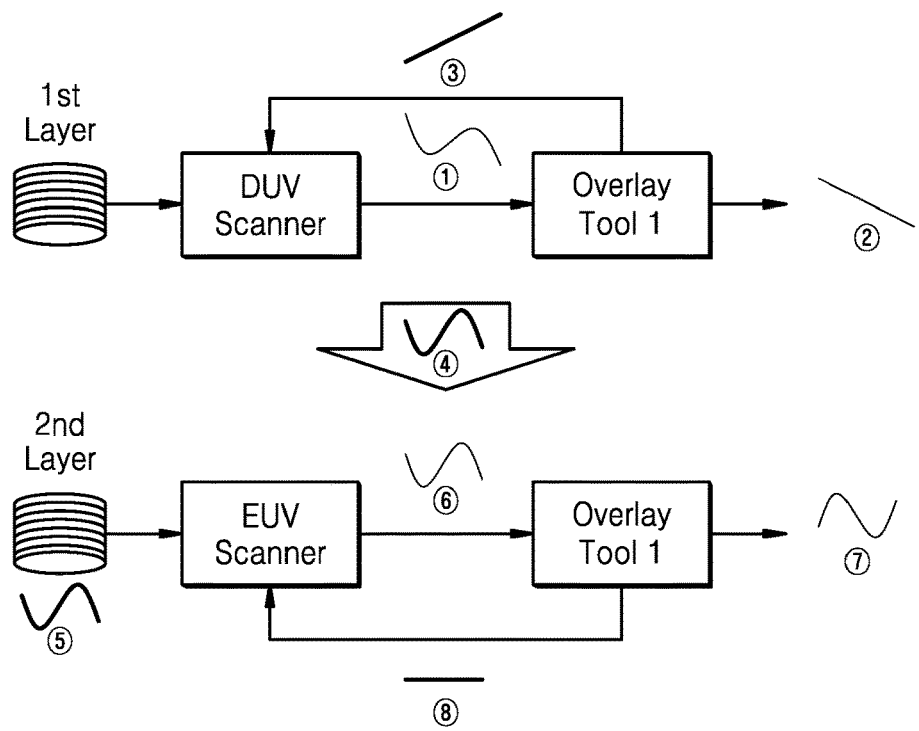
FIGS. 8A and 8B are conceptual diagrams that illustrate an overlay measurement method according to a comparative embodiment and an overlay measurement method according to an embodiment of the inventive concept, respectively, in relation to the overlay measurement method of FIG. 7.
Figure 8B:
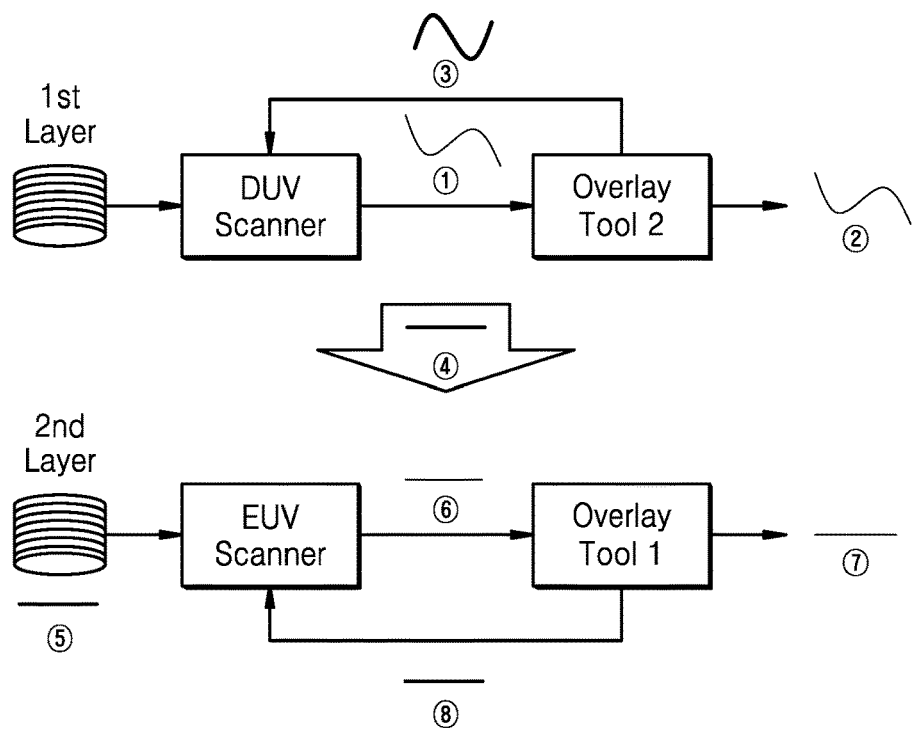

FIGS. 8A and 8B are conceptual diagrams for illustrating an overlay measurement method according to a comparative embodiment and an overlay measurement method according to a present embodiment, respectively, with respect to the overlay measurement method of FIG. 7.

Referring to FIG. 8A, a "DUV scanner" may denote a DUV apparatus configured to perform an exposure process by using a DUV wavelength, an "EUV scanner" may denote a EUV apparatus configured to perform an exposure process by using an EUV wavelength, and an "overlay tool1" may denote an apparatus configured to perform a relative measurement on an overlay. Also, each of denotations ① through ⑧ represents an overlay or the amount of correction of the overlay. For example, ① may indicate a K13 component of the overlay that is generated in an exposure process by the DUV apparatus.

In the case of the overlay measurement method according to the comparative embodiment, the overlay may be measured only by using a relative measurement method. Thus, when the overlay of a first layer is measured, because there is no lower layer, the overlay may be detected and calculated by using a stitch overlay method. As described above, in the case of the stitch overlay method, only a linear component of the overlay may be calculated. Thus, a calculation result may correspond to a linear form, as illustrated by ②. Also, the amount of correction of the overlay component of the linear form may be fed back to the DUV apparatus, and based on the amount of correction, an overlay input value of the DUV apparatus may be changed. ③ illustrates the form of the amount of correction of the overlay component of the linear form and may have the form opposite to the linear form of ④ described above.

The overlay input value of the DUV apparatus may be changed based on the feedback, the exposure process may be performed again by the DUV apparatus having the changed overlay input value, and an overlay component such as ④ may be generated, as the amount of correction described above is added to the K13 component. As a result, the K13 component may not be removed, and the K13 component may be further increased. Hereinafter, the further increased K13 component will be referred to as a K13' component.

When the first overlay mark is formed on the first layer of the second semiconductor substrate by the DUV apparatus having the changed overlay input value, and the second overlay mark is formed on the second layer of the second semiconductor substrate by the EUV apparatus, the K13' component due to the DUV apparatus may be intactly retained on the first layer. ⑤ and ⑥ illustrate that the K13' component is intactly retained on the first layer. ⑤ and ⑥ may illustrate the K13' component on the first layer before the exposure process by the EUV apparatus and after the exposure process by the EUV apparatus, respectively. Although the K13 component may be generated due to the EUV apparatus, the K13 component generated due to the EUV apparatus may be assumed to be insignificant.

Figure 8C:
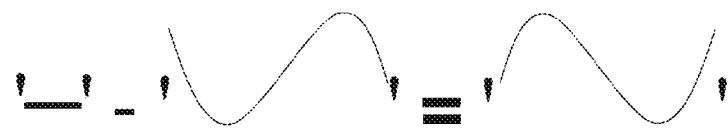
FIG. 8C shows a relative measurement.

When a relative measurement is performed on the overlay after the second overlay mark is formed by the EUV apparatus, an overlay component having the form of ⑦ may be calculated. In detail, when, for example, it is assumed that there is no overlay due to the EUV apparatus and the assumption is indicated as '-', the relative measurement may be indicated as shown in FIG. 8C.

Accordingly, a result of the relative measurement may have the form of ⑦. Hereinafter, ⑦ will be referred to as a K13" component.

In the EUV apparatus, neither the K13 component nor the K13' and K13" components modified from the K13 component may be corrected. Thus, '-' of ⑧ may indicate that it is not possible to correct an overlay component in the EUV apparatus.

Accordingly, in an environment in which the first layer is exposed by the DUV apparatus, and the second layer is exposed by the EUV apparatus, the K13 component of the overlay may not be corrected at all, in the case of the overlay measurement method using only the relative measurement, according to the comparative embodiment.

Referring to FIG. 8B, the "DUV scanner," the "EUV scanner," and the "overlay tool1" denote the same elements as described above with reference to FIG. 8A. Also, each of figures ① through ⑧ illustrates an overlay. An "overlay tool2" may denote an apparatus performing an absolute measurement on the overlay.

The overlay measurement method according to the present embodiment of the inventive concept may measure an overlay based not only on a relative measurement, but also an absolute measurement. Also, according to the overlay measurement method according to the present embodiment, the overlay may be measured with respect to a first layer by using an absolute measurement method. Thus, a calculation result may be output as a curved form corresponding to the K13 component as illustrated by ②. Also, the amount of correction of the K13 component of the curved form may be fed back to the DUV apparatus, and an overlay input value of the DUV apparatus may be changed. ③ illustrates the form of the amount of correction by which the K13 component of the curved form may be corrected and may have the form opposite the curved form of ② described above.

An overlay input value of the DUV apparatus may be changed based on the feedback, the exposure process may be performed again by the DUV apparatus having the changed overlay input value, and the K13 component may be removed to correspond to the form of '-' of ④ as the amount of correction described above is added to the previous K13 component.

When the first overlay mark is formed on the first layer of the second semiconductor substrate by the DUV apparatus having the changed overlay input value, and the second overlay mark is formed on the second layer of the second semiconductor substrate by the EUV apparatus, the K13 component may not be present on the first layer. "-" of ⑤ and ⑥ indicates that there is no K13 component on the first layer. ⑤ and ⑥ may indicate the K13 component on the first layer before the EUV exposure process and after the EUV exposure process, respectively. As described above, although the K13 component may be generated on account of the EUV apparatus, the K13 component generated on account of the EUV apparatus may be assumed to be insignificant.

When a relative measurement is performed on the overlay after the exposure process by the EUV apparatus, an overlay component having the form of ⑦ may be calculated. In detail, when it is assumed that there is no overlay directly due to the EUV apparatus and the assumption is indicated as '-', the relative measurement may be indicated as below.

'-'-'-'='-'

Accordingly, a result of the relative measurement may have the form of ⑦. As a result, in the exposure process on the second layer using the EUV apparatus, the K13 component may not be generated or may be reduced or minimized. To more accurately describe this aspect, only the K13 component generated on account of the EUV apparatus may be present at an insignificant level, and the K13 component generated on account of the DUV apparatus may be removed. As a result, the K13 component on the second layer may be reduced or minimized. "-" of ⑧ of FIG. 8B may indicate that there is no overlay component to be corrected in the EUV apparatus or that there is no need to correct the overlay component.

Figure 9:
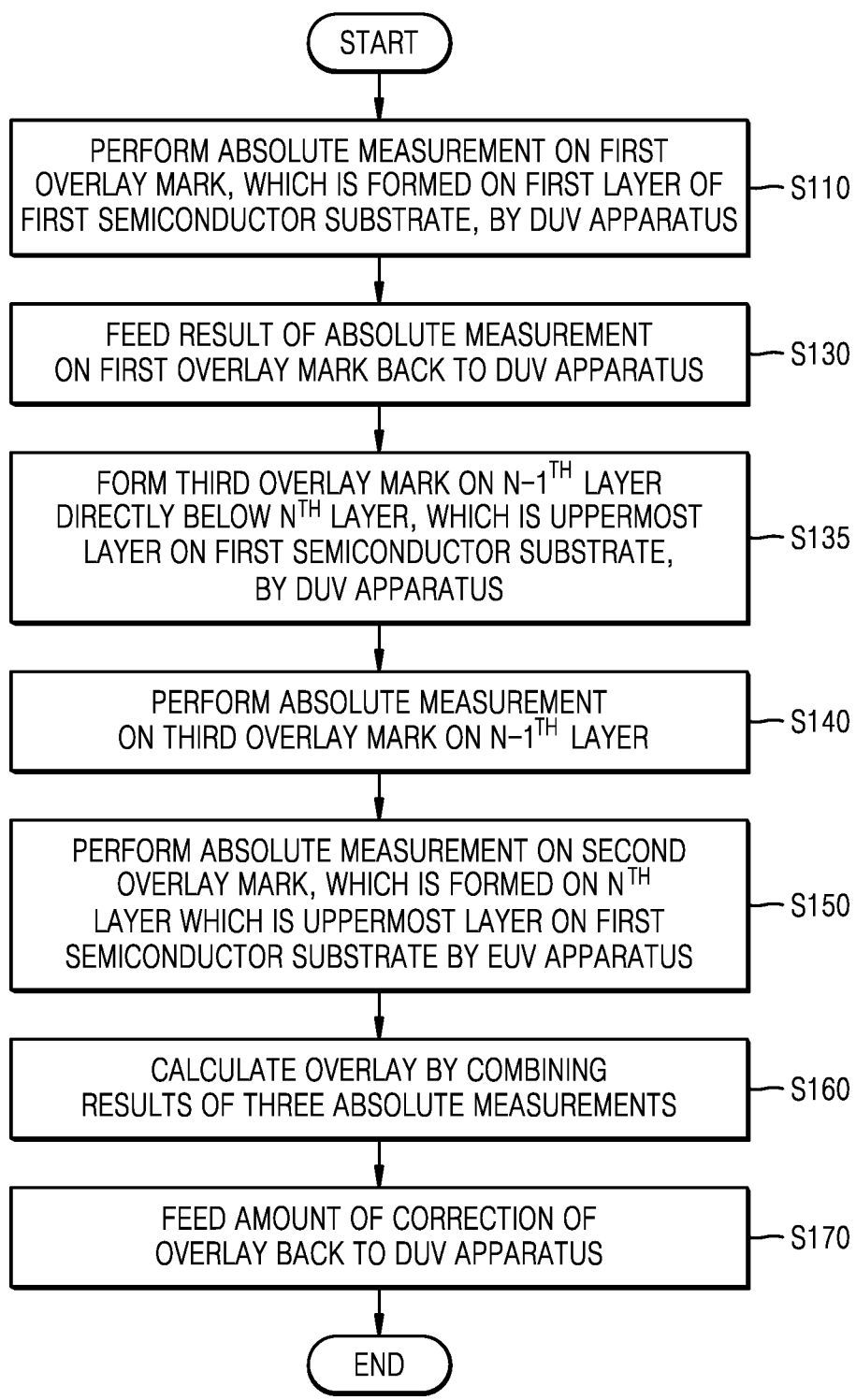
FIG. 9 is a schematic flowchart of an overlay measurement method according to an embodiment of the inventive concept in which three or more layers are provided on a semiconductor substrate, in the overlay measurement method of FIG. 1.

FIG. 9 is a schematic flowchart of an overlay measurement method according to an embodiment of the inventive concept in which three or more layers are provided on a semiconductor substrate, in the overlay measurement method of FIG. 1. The aspects described above with reference to FIGS. 1 through 8B will be briefly described or omitted.

Referring to FIG. 9, the overlay measurement method according to the present embodiment may correspond to an embodiment of the overlay measurement method of FIG. 1, in which n is 3, that is, the nth layer that is the uppermost layer is a third or higher layer. In detail, the overlay measurement method according to the present embodiment may sequentially include performing the absolute measurement on the first overlay mark (S110) and feeding the result of the absolute measurement back to the DUV apparatus (S130). Aspects with respect to the operations S110 and S130 are as described above with reference to FIG. 1. As described above, the performing of the absolute measurement on the first overlay mark (S110) and the feeding of the result of the absolute measurement back to the DUV apparatus (S130) may include performing the relative measurement on the first overlay mark and feeding the result of the relative measurement back to the DUV apparatus.

Next, a third overlay mark may be formed on the n−1th layer, which is directly below the nth layer that is the uppermost layer on the first semiconductor substrate, by using the DUV apparatus (S135). Here, the forming (S135) of the third overlay mark on the n−1th layer may include measuring a position of an overlay mark of each layer and feeding back a result of the measurement, similarly to the operations S110 and S130. However, a relative measurement may be performed on the overlay mark of each of the second through n−1th layers and results of the relative measurements may be fed back to the DUV apparatus.

Thereafter, an absolute measurement may be performed on the third overlay mark on the n−1th layer (S140). The absolute measurement of the position of the third overlay mark on the n−1th layer may be performed to relatively more accurately measure the K13 component, because the exposure process on the nth layer, which is above the n−1th layer, is performed by the EUV apparatus. This aspect may substantially correspond to the above-described reason that the absolute measurement is performed on the overlay mark of the first layer in the overlay measurement method of FIG. 7.

As described above, a relative measurement may also be performed on the third overlay mark on the n−1th layer. This may be performed to feed a result of measuring an overlay with respect to an n−2th layer below the n−1th layer back to the DUV apparatus. The result of the absolute measurement of the position of the third overlay mark on the n−1th layer may not be directly fed back to the DUV apparatus and may be stored. In other words, the result of the absolute measurement on the third overlay mark on the n−1th layer may be combined with the result of the absolute measurement on the first overlay mark on the first layer and the result of the absolute measurement on the second overlay mark on the nth layer and may be used to relatively more accurately calculate the K13 component.

Further, an absolute measurement may be performed on the second overlay mark, which is formed on the nth layer of the first semiconductor substrate by using the EUV apparatus (S150). Also, a relative measurement may be performed on the second overlay mark. In the case where three or more layers are provided, the third overlay mark on the n−1th layer may be formed by using the DUV apparatus, and thus, to accurately calculate the K13 component on the nth layer, an absolute measurement may be performed on the third overlay mark on the n−1th layer. Also, the absolute measurement may be performed on the first overlay mark on the first layer. This may be because, as described above with reference to FIG. 8A, when the relative measurement is performed on the first overlay mark on the first layer, the K13 component on the first layer may not be accurately calculated, and because relative measurements are performed on layers above the first layer, the K13 component generated in the first layer may further affect the layers above the first layer. As a result, to accurately calculate the K13 component, the absolute measurement may be performed on the first overlay mark on the first layer, regardless of the number of layers.

Thereafter, an overlay may be calculated by combining results of three absolute measurements (S160). Here, the results of the three absolute measurements may include the result of the absolute measurement of the position of the first overlay mark on the first layer, the result of the absolute measurement of the position of the third overlay mark on the n−1th layer, and the result of the absolute measurement of the position of the second overlay mark on the nth layer. Also, the calculation of the overlay may include, for example, a calculation of the K13 component. However, the calculation of the overlay may not be limited to the calculation of the K13 component and may include calculations of other components. By combining the results of the three absolute measurements, the overlay, in particular, the K13 component, may be accurately calculated.

After the calculation of the overlay, the amount of correction of the overlay may be fed back to the DUV apparatus (S170). The amount of correction of the overlay may include, for example, the amount of correction of the K13 component. An overlay input value of the DUV apparatus may be changed, based on the amount of correction of the overlay, that is, the amount of correction of the K13 component, fed back to the DUV apparatus. Thereafter, exposure processes may be performed on the first through n−1th layer on the second semiconductor substrate by using the DUV apparatus having the changed overlay input value. Also, an exposure process may be performed on the nth layer on the second semiconductor substrate by using the EUV apparatus. Based on the more accurately calculated amount of correction of the K13 component, the K13 component in the exposure process by the DUV apparatus may be removed, reduced, or minimized, and the K13 component in the exposure process by the EUV apparatus may be reduced or minimized. A result of the relative measurement of the position of the second overlay mark may be fed back to the EUV apparatus.

Figure 10:
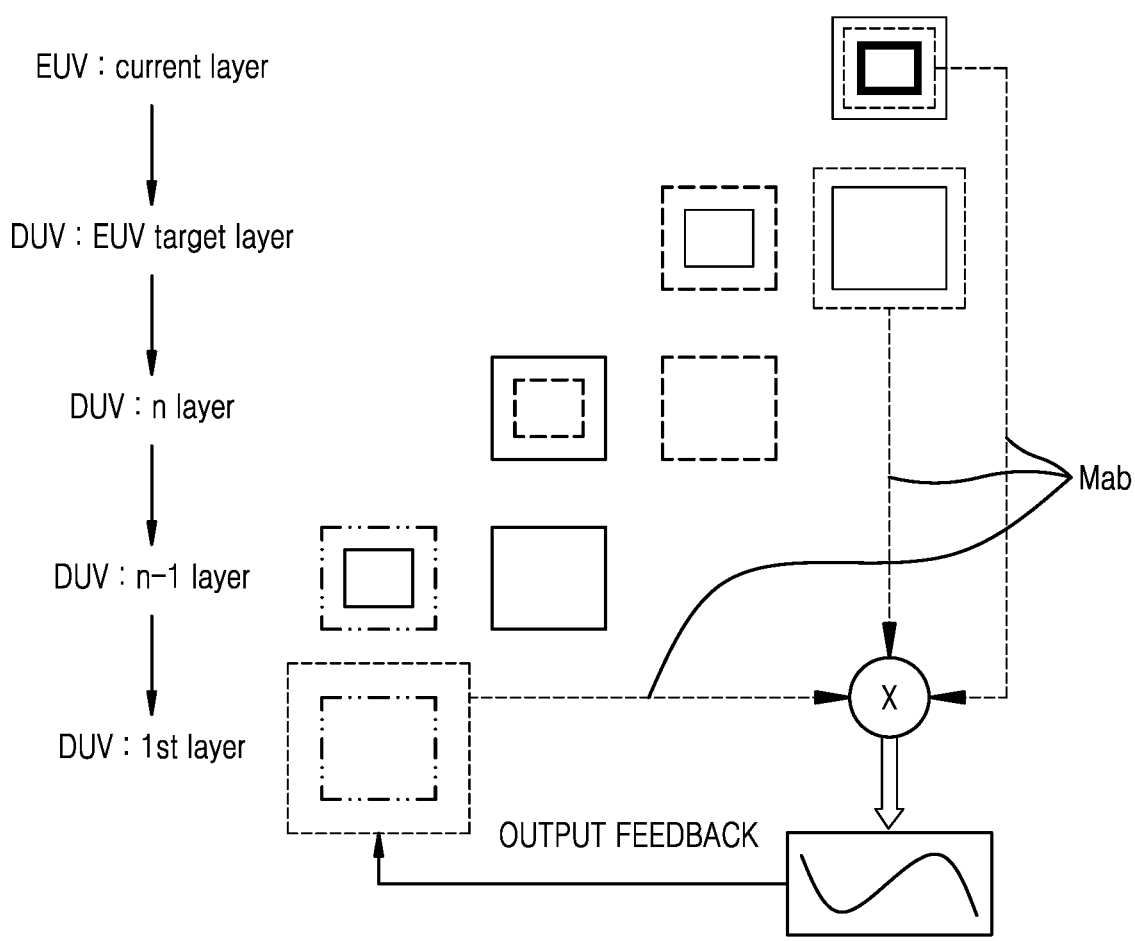
FIG. 10 is a conceptual diagram of the overlay measurement method of FIG. 9.

FIG. 10 is a conceptual diagram of the overlay measurement method of FIG. 9 according to an embodiment of the inventive concept. FIG. 10 will be described by referring to FIG. 9, and the aspects described above with reference to FIGS. 1 through 9 will be briefly described or omitted.

Referring to FIG. 10, an absolute measurement may be performed on the overlay mark on the first layer. Relative measurements may be performed on the overlay marks on the second through n−1th layers. Also, absolute measurements may be performed on the overlay marks on the n−1th layer and the nth layer. A relative measurement may be performed on the overlay mark on the first layer and a relative measurement may be performed on the overlay mark on the nth layer.

As indicated by the operation flow illustrated on the left side of the drawing of FIG. 10, the overlay marks on the first through n−1th layers may be formed by exposure processes by the DUV apparatus, and the overlay mark on the nth layer may be formed by an exposure process by the EUV apparatus. A current layer on which the exposure process by the EUV apparatus is performed may correspond to the nth layer, and a EUV target layer which may be aligned with the current layer may correspond to the n−1th layer directly below the nth layer.

In FIG. 10, overlay marks on which absolute measurements are performed are surrounded by thin dashed squares. That is, the absolute measurements may be performed on an overlay outer mark on the first layer, an overlay outer mark on the n−1th layer, and an overlay inner mark on the nth layer. Also, the absolute measurements may be simultaneously performed or performed in coordination with one another on the overlay inner mark and the overlay outer mark. As shown by the dashed arrows, the accurate amount of correction of the K13 component may be calculated by combining results Mab of three absolute measurements. The curved form below the combination sign (D) may correspond to the calculated amount of correction of the K13 component. The amount of correction of the K13 component may be fed back to the DUV apparatus. The DUV apparatus may have a changed overlay input value based on the amount of correction of the K13 component. Thereafter, an exposure process may be performed on the first through n−1th layer by the DUV apparatus having the changed overlay input value. Also, an exposure process may be performed on the nth layer by the EUV apparatus.

For reference, in the case of a relative measurement, a main pattern of a lower layer and a Vernier pattern of an upper layer may be measured together. Thus, in FIG. 10, the double square shape indicates the main pattern of the lower layer and the Vernier pattern of the upper layer together. An overlay mark on the lower layer may function as the main pattern with respect to an overlay mark on the upper layer. For example, a large overlay mark having the same side shape as an inner small square is indicated beside the double square, wherein the large overlay mark may correspond to the main pattern corresponding to the Vernier pattern of the upper layer.

Figure 11A:
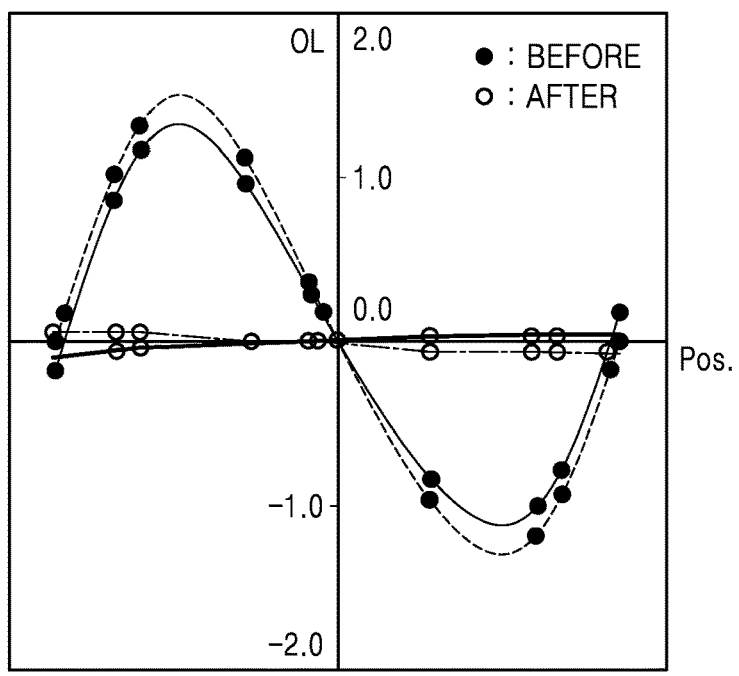
FIGS. 11A and 11B include graphs that illustrate an overlay improvement effect by comparing an overlay measurement method according to a comparative embodiment and an overlay measurement method according to an embodiment of the inventive concept, respectively.
Figure 11B:
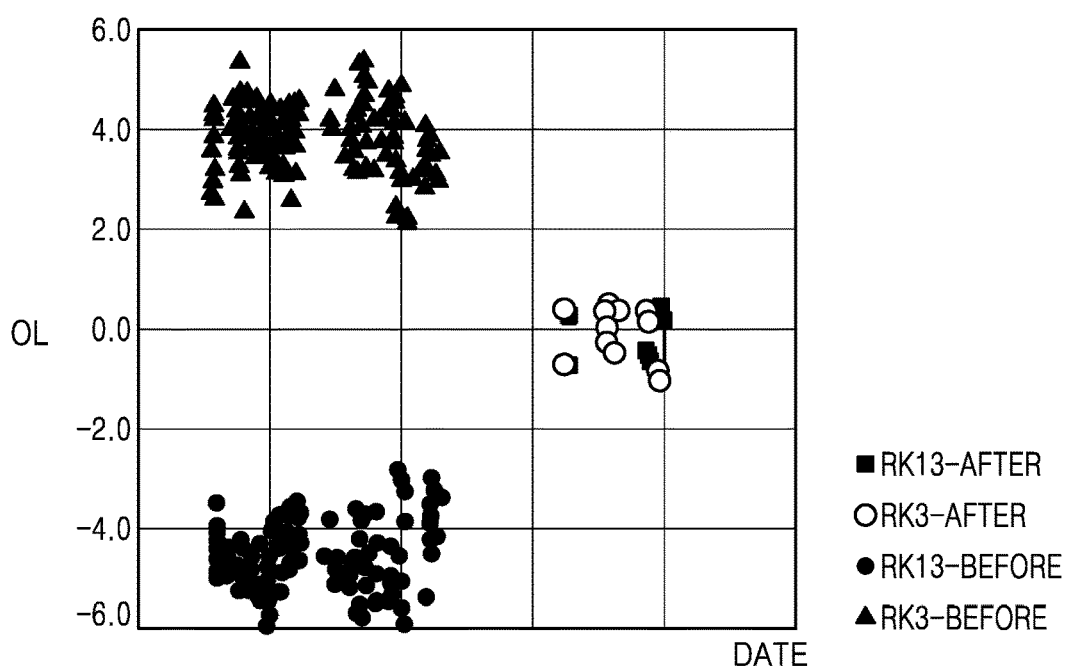

FIGS. 11A and 11B illustrate graphs showing an overlay improvement effect according to an overlay measurement method according to a comparative embodiment and an overlay measurement method according to an embodiment of the inventive concept, respectively. In FIGS. 11A and 11B, an x axis indicates a position, a y axis indicates a size of an overlay, and units of both of the x axis and the y axis are arbitrary units. Referring to FIGS. 11A and 11B, an overlay measurement value • according to the comparative embodiment may denote a value measured by an overlay measurement method before an overlay measurement method according to the present embodiment is applied. As shown in the graphs of FIGS. 11A and 11B, from an overlay measurement value ● according to the present embodiment, compared with the overlay measurement value • according to the comparative embodiment, a great reduction of the overlay, for example, the K13 component, may be identified. For reference, two graphs of each of the overlay measurement methods according to the comparative embodiment and the present embodiment may generally correspond to two wafer stages in the DUV apparatus and the EUV apparatus, that is, two chucks.

Figure 12:
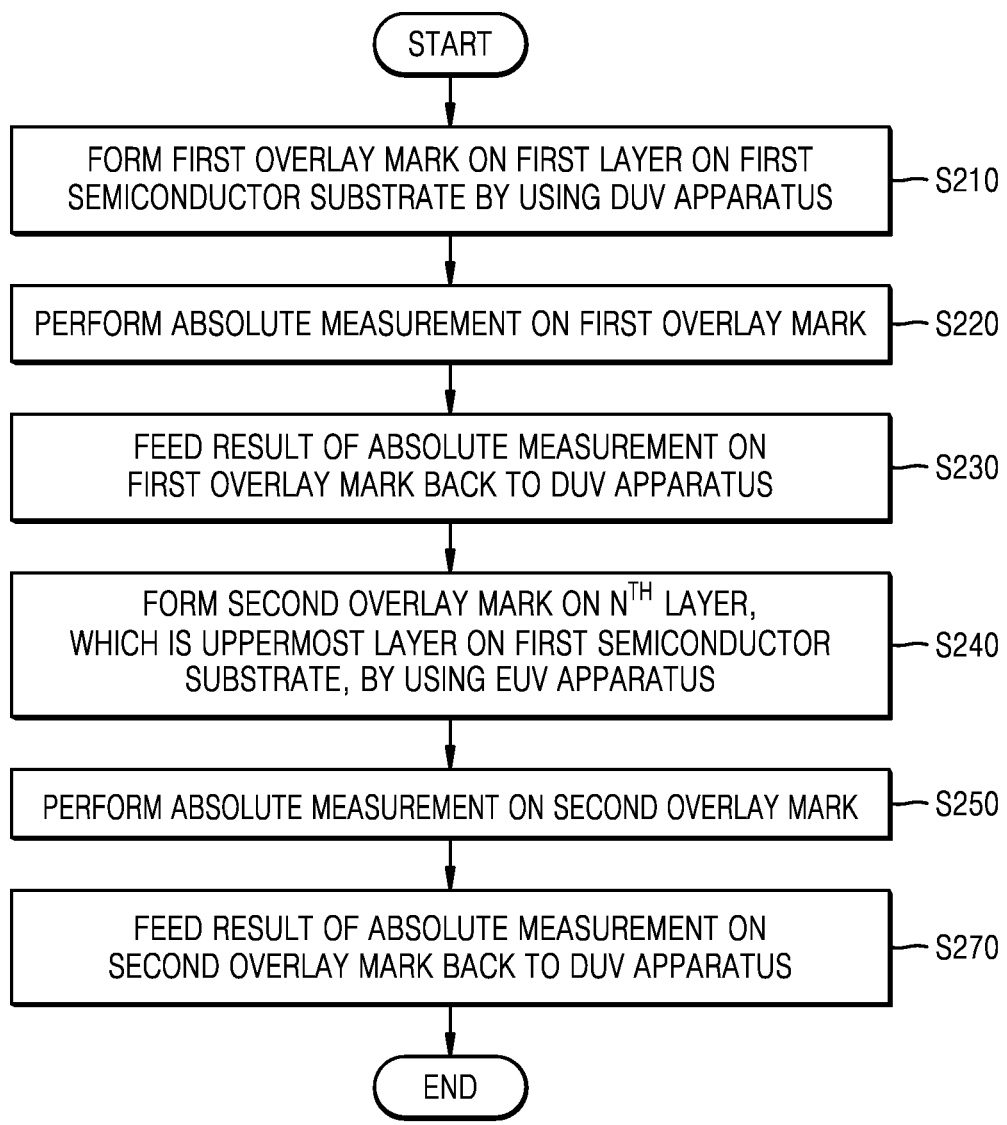
FIG. 12 is a schematic flowchart of a method of manufacturing a semiconductor device, which uses an overlay measurement method according to an embodiment of the inventive concept.
Figure 13:
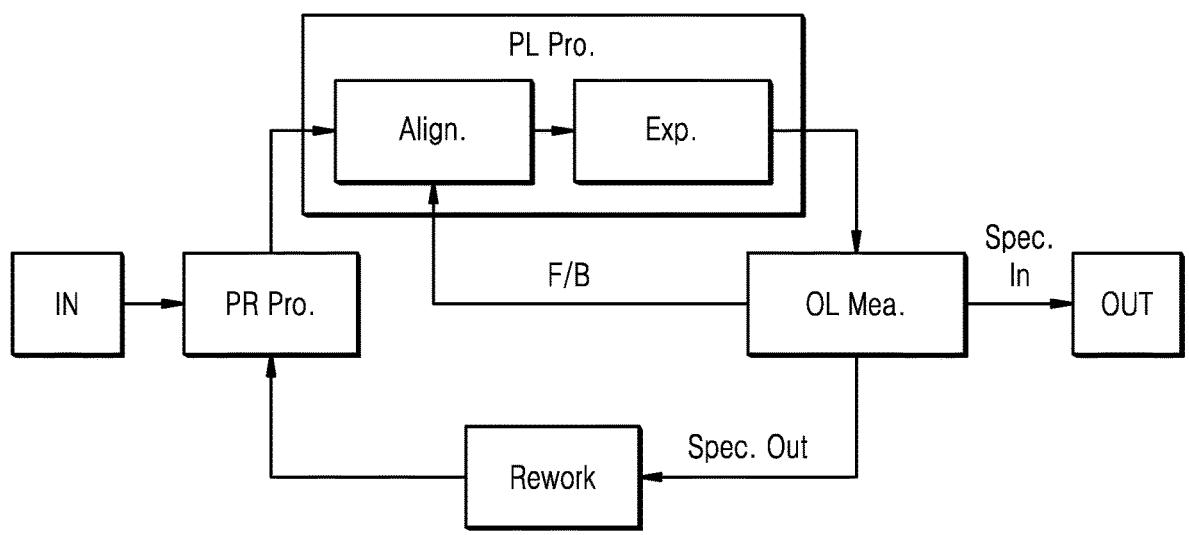
FIG. 13 is a conceptual diagram illustrating a general process of forming an overlay mark and measuring an overlay, according to an embodiment of the inventive concept, in the method of manufacturing the semiconductor device of FIG. 12.

FIG. 12 is a schematic flowchart of a method of manufacturing a semiconductor device using an overlay measurement method according to an embodiment of the inventive concept, and FIG. 13 is a conceptual diagram of a general process of forming an overlay mark and measuring an overlay, in the method of manufacturing the semiconductor device of FIG. 12. The aspects described above with reference to FIGS. 1 through 10 will be briefly described or omitted.

Referring to FIGS. 12 and 13, the method of manufacturing the semiconductor device using the overlay measurement method according to an embodiment (hereinafter, simply referred to as the "semiconductor manufacturing method"), may include, first, forming a first overlay mark on a first layer on a first semiconductor substrate by using a DUV apparatus (S210). Here, "forming an overlay mark" may denote "forming a device pattern including the overlay mark," and likewise, "removing an overlay mark" may denote "removing a device pattern including the overlay mark." The same concepts may be applied below. Thereafter, an absolute measurement may be performed on the first overlay mark (S220), and a result of the absolute measurement of the position of the first overlay mark may be fed back to the DUV apparatus (S230).

A process from the operation S210 in which the first overlay mark is formed to the operation S230 in which the result is fed back to the DUV apparatus will be described in relation to a general semiconductor manufacturing process by referring to FIG. 13. First, when the process enters into an operation (IN) of forming a device pattern, a photoresist process (PR Pro.) in which a photoresist is formed on a corresponding layer of a semiconductor substrate may be performed, and a photolithography process (PL Pro.) may be performed. The photolithography process (PL Pro.) may include an alignment process (Align.) in which a wafer or the semiconductor substrate is aligned and an exposure process (Exp.) in which exposure is performed by an exposing apparatus. In relation to the operation S210 in which the first overlay mark is formed, the exposure apparatus may correspond to the DUV apparatus. The photoresist process (Pr Pro.) and the photolithography process (PL Pro.) may correspond to the operation S210 in which the first overlay mark is formed.

Thereafter, an overlay measurement process (OL Mea.) may be performed. When a result of the overlay measurement is within a predetermined specification (Spec. In), the process of forming the device pattern may be ended (OUT). However, when the result of the overlay measurement deviates from the predetermined specification (Spec. Out), a rework of removing the first overlay mark may be performed, and then, the photoresist process (PR Pro.) may be performed again. Also, a result of the overlay measurement may be fed to the corresponding exposure apparatus (F/B), and an overlay input value of the exposure apparatus may be changed.

The overlay measurement process (OL Mea.) may correspond to the operation S220 in which the absolute measurement is performed on the first overlay mark and to the operation S230 in which a result of the absolute measurement fed back to the exposure apparatus is fed back to the DUV apparatus. The descriptions are given based on the first overlay mark and the absolute measurement, but the same process may be performed with respect to a second overlay mark or a third overlay mark and an absolute measurement or a relative measurement, described hereinafter.

Further, referring to FIG. 12, the second overlay mark may be formed on an nth layer that is the uppermost layer of a first semiconductor substrate by using a EUV apparatus (S240). Here, when the nth layer is a second layer, the n−1th layer may be a first layer, and thus, the process may remain the same. However, when the nth layer is a third or higher layer, a process of forming and measuring overlay marks on the second through n−1th layers may be included.

Next, an absolute measurement may be performed on the second overlay mark (S250). Based on the value of n of the nth layer, the method of measuring the overlay mark on the n−1th layer below the nth layer may be changed. For example, when the nth layer is the second layer, the n−1th layer may be the first layer, and thus, the description about the first overlay mark on the first layer may be applied. When the nth layer is the third or higher layer, the n−1th layer may be the second or higher layer, and thus, a process of performing an absolute measurement on the overlay mark on the n−1th layer may be included.

Thereafter, a result of the absolute measurement of the position of the second overlay mark may be fed back to the DUV apparatus (S270). The operation of performing the absolute measurement on the second overlay mark (S250) and the operation of feeding the result of the absolute measurement back to the DUV apparatus (S270) may include performing a relative measurement on the second overlay mark and feeding a result of the relative measurement back to the EUV apparatus.

After measuring the second overlay mark, when the result of the measurement is within a specification, subsequent corresponding semiconductor processes may be performed to manufacture a desired semiconductor device. When the result of the measurement deviates from the specification, after a rework of removing the second overlay mark, an overlay input value of an exposure apparatus may be changed, and then, the operation of forming the second overlay mark (S240) may be performed.

Figure 14:
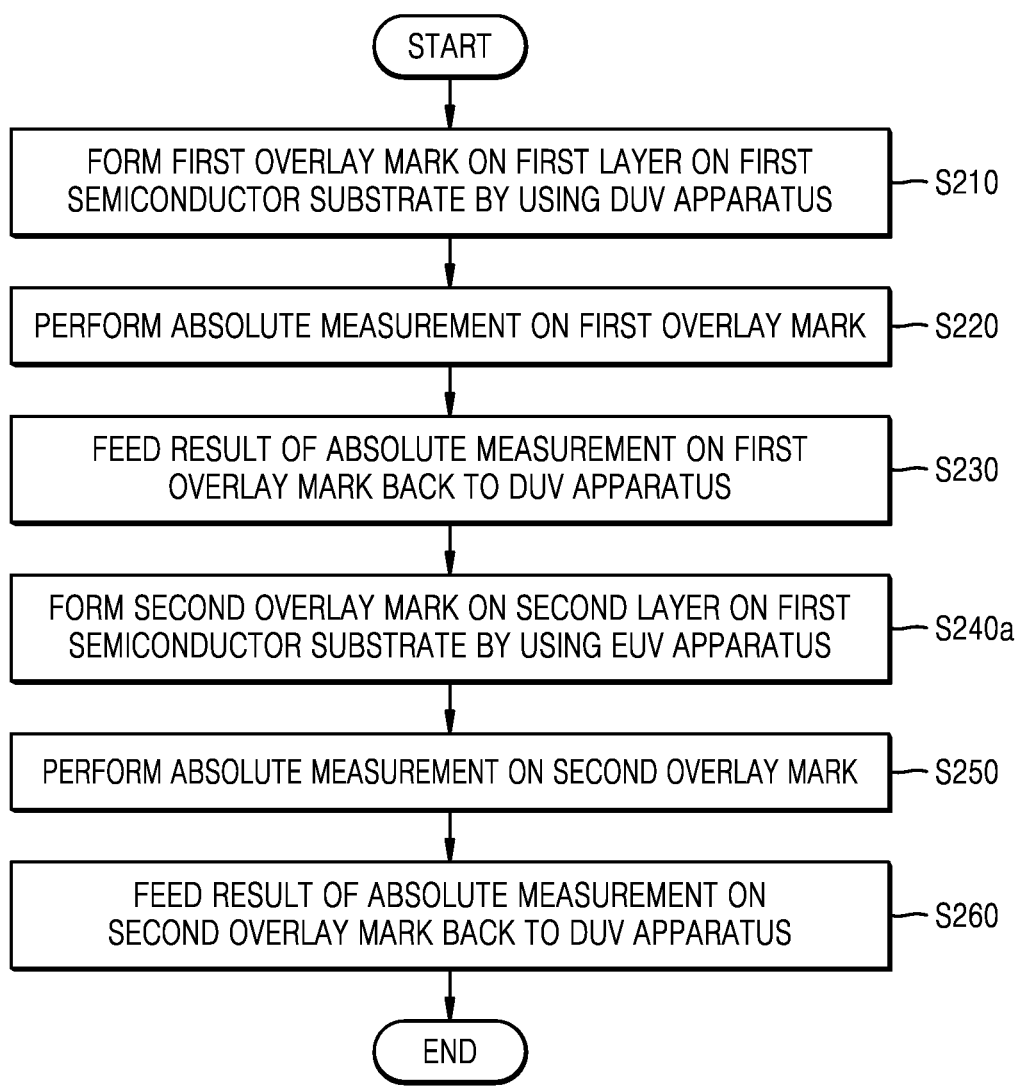
FIG. 14 is a schematic flowchart of a method of manufacturing a semiconductor device, according to an embodiment of the inventive concept, in which two layers are provided on a semiconductor substrate, in the method of manufacturing the semiconductor device of FIG. 12.

FIG. 14 is a schematic flowchart of a method of manufacturing a semiconductor device, according to an embodiment of the inventive concept in which two layers are provided on a semiconductor substrate using the method of manufacturing the semiconductor device of FIG. 12. The aspects described above with reference to FIGS. 12 and 13 will be briefly described or omitted.

Referring to FIG. 14, the overlay measurement method according to the present embodiment may sequentially include operations from the forming of the first overlay mark (S210) to the feeding of the result of the absolute measurement back to the DUV apparatus (S230). The operations from the forming of the first overlay mark (S210) to the feeding of the result of the absolute measurement back to the DUV apparatus (S230) are the same as described above with reference to FIG. 12.

Thereafter, a second overlay mark may be formed on a second layer of a first semiconductor substrate by using a EUV apparatus (S240a), and an absolute measurement may be performed on the second overlay mark (S250). Also, a relative measurement may be performed on the second overlay mark. Thereafter, a result of the absolute measurement on the second overlay mark may be fed back to the DUV apparatus (S270). Also, a result of the relative measurement on the second overlay mark may be fed back to the EUV apparatus. Subsequent processes according to the result of the measurement on the second overlay mark are as described above with reference to FIG. 12.

Figure 15:
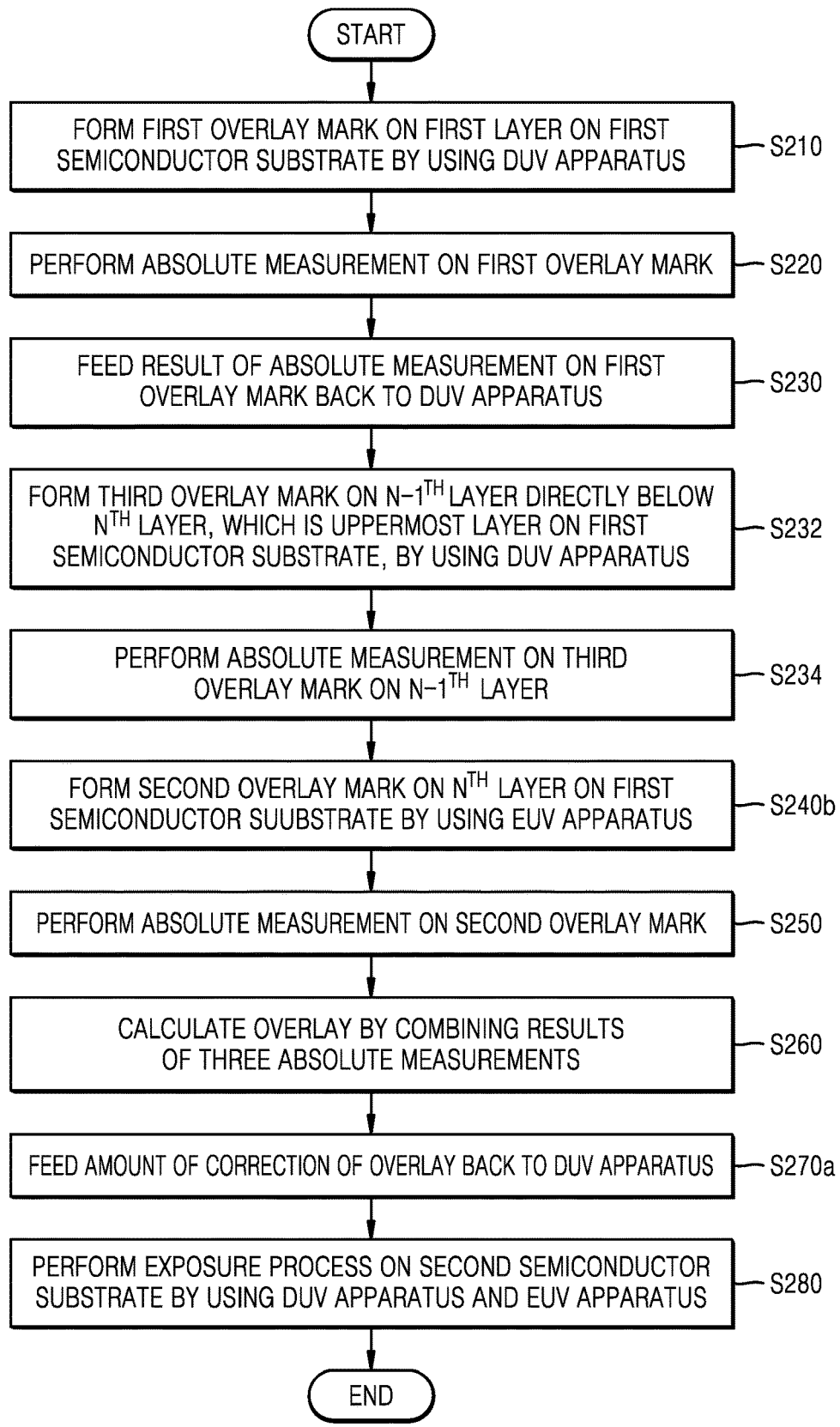
FIG. 15 is a schematic flowchart of a method of manufacturing a semiconductor device, according to an embodiment of the inventive concept, in which three or more layers are provided on a semiconductor substrate, in the method of manufacturing the semiconductor device of FIG. 12.

FIG. 15 is a schematic flowchart of a method of manufacturing a semiconductor device, according to an embodiment in which three or more layers are provided on a semiconductor substrate using the method of manufacturing the semiconductor device of FIG. 12. The aspects described above with reference to FIGS. 12 and 13 will be briefly described or omitted.

Referring to FIG. 15, the overlay measurement method according to the present embodiment may sequentially include operations from the forming of the first overlay mark (S210) to the feeding of the result of the absolute measurement back to the DUV apparatus (S230). The operations from the forming of the first overlay mark (S210) to the feeding of the result of the absolute measurement back to the DUV apparatus (S230) are as described above with reference to FIG. 12.

Next, a third overlay mark may be formed on an n-1th layer which is directly below an nth layer that is the uppermost layer on a first semiconductor substrate by using the DUV apparatus (S232). Here, the forming of the third overlay mark on the n-1th layer (S232) may include the process as described above with reference to FIG. 13. For example, the overlay mark on each layer may be formed and measured, and the result of the measurement may be fed back. However, a relative measurement may be performed on the overlay mark of each of the second through n-1th layers, and a result of the measurement may be fed back to the DUV apparatus.

Thereafter, an absolute measurement may be performed on the third overlay mark on the n-1th layer (S234). Also, a relative measurement may be performed together on the third overlay mark on the n-1th layer. The absolute measurement and the relative measurement of the position of the third overlay mark on the n-1th layer are as described above with respect to the operation (S140) of performing the absolute measurement on the third overlay mark on the n-1th layer of FIG. 9.

Further, a second overlay mark may be formed on the nth layer of the first semiconductor substrate by a EUV apparatus (S240b), and an absolute measurement may be performed on the second overlay mark (S250). The second overlay mark may be formed by a process as described above with reference to FIG. 13. The absolute measurement on the second overlay mark is as described above with respect to the operation (S150) of performing the absolute measurement on the second overlay mark of FIG. 9. In the operation (S250) of performing the absolute measurement on the second overlay mark, a relative measurement on the second overlay mark may be performed together.

Thereafter, by combining results of three absolute measurements, an overlay may be calculated (S260), and the amount of correction of the overlay may be fed back to the DUV apparatus (S270a). The calculation of the overlay and the feeding of the amount of correction of the overlay back to the DUV apparatus are the same as the operation (S160) of calculating the overlay and the operation (S170) of feeding the amount of correction of the overlay back to the DUV apparatus of FIG. 9. A result of the relative measurement of the position of the second overlay mark may be fed back to the EUV apparatus.

Thereafter, an exposure process may be performed on a second semiconductor substrate by the DUV apparatus and the EUV apparatus (S280). An overlay input value of the DUV apparatus may be changed based on the feedback, and thus, the K13 component in the exposure processes on the layers from the first layer through the n-1th layer using the DUV apparatus may be removed, reduced, or minimized. Also, the K13 component in the exposure process on the nth layer using the EUV apparatus may be reduced or minimized. After performing the exposure process on the second semiconductor substrate by using the DUV apparatus and the EUV apparatus, corresponding semiconductor processes may be subsequently performed to manufacture a desired semiconductor device.

Figure 16:
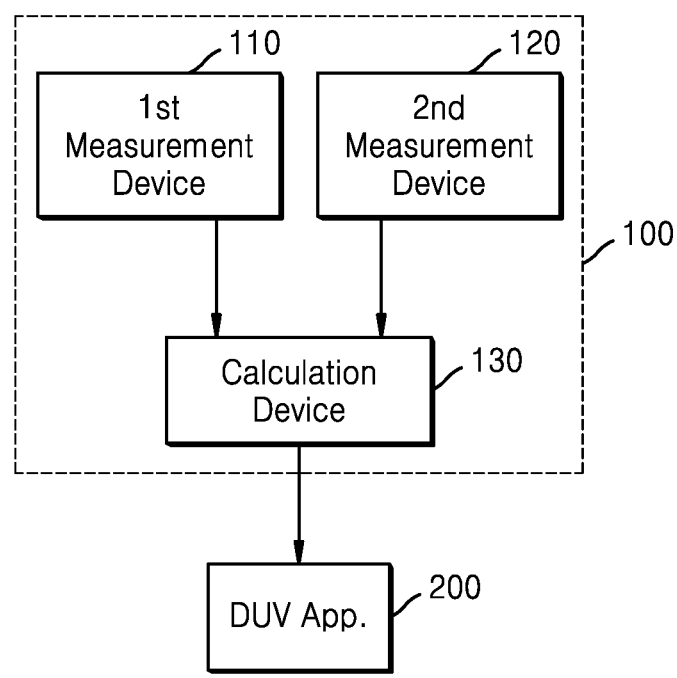
FIG. 16 is a schematic block diagram of an overlay measurement apparatus using an overlay measurement method, according to an embodiment of the inventive concept.

FIG. 16 is a schematic block diagram of an overlay measurement apparatus using an overlay measurement method, according to an embodiment of the inventive concept. FIG. 16 will be described with reference to FIGS. 1 and 9 together, and the aspects described above with reference to FIGS. 1 through 15 will be briefly described or omitted.

Referring to FIG. 16, an apparatus for measuring an overlay 100 (hereinafter, simply referred to as an "overlay measurement apparatus") using the overlay measurement method according to an embodiment of the inventive concept may include a first measurement device 110, a second measurement device 120, and a calculation device 130.

The first measurement device 110 may be a relative measurement device configured to perform a relative measurement on an overlay mark. For example, in the overlay measurement apparatus 100 according to an embodiment, when a semiconductor substrate includes two layers, the first measurement device 110 may be configured to perform the relative measurement on overlay marks on a first layer and a second layer, respectively, and when the semiconductor substrate includes three or more layers, the first measurement device 110 may be configured to perform the relative measurement on overlay marks on the first through nth layers, respectively.

The second measurement device 120 may be an absolute measurement device configured to perform an absolute measurement on an overlay mark. For example, in the overlay measurement apparatus 100, according to an embodiment, when the semiconductor substrate includes two layers, the second measurement device 120 may be configured to perform the absolute measurement on the overlay marks on the first layer and the second layer, respectively, and when the semiconductor substrate includes three or more layers, the second measurement device 120 may be configured to perform the absolute measurement on overlay marks on the first layer, the n−1th layer, and the nth layer, respectively.

The calculation device 130 may accurately calculate the overlay by combining results of the absolute measurements. For example, the calculation device 130 may be configured to accurately calculate the K13 component of the overlay by combining the results of the absolute measurements on the overlay marks of the first layer, the n−1th layer, and the nth layer, respectively. Also, the calculation device 130 may be configured to calculate the amount of correction of the component tK13 corresponding to the calculated K13 component. The amount of correction of the K13 component calculated by the calculation device 130 may be fed back to a DUV apparatus 200.

Based on measurement results of the first measurement device 110 and the second measurement device 120, the calculation device 130 may be configured to calculate other components of the overlay, in addition to the K13 component, and may be configured to calculate the amount of correction of the other calculated components. The amount of correction of the other components may be fed back to an exposure apparatus corresponding thereto. For example, the amount of correction of the other components may be fed back to the DUV apparatus 200 or a EUV apparatus configured to perform a corresponding exposure process.

While the inventive concept has been particularly shown and described with reference to embodiments thereof, it will be understood that various changes in form and details may be made therein without departing from the spirit and scope of the following claims.

What is claimed is:

1. An overlay measurement method comprising:
performing an absolute measurement of a position of an overlay mark of at least one of a plurality of layers based on a fixed position,
wherein an exposure process is performed on a first layer of the plurality of layers by using a deep ultraviolet (DUV) apparatus, and
wherein an exposure process is performed on an nth layer, which is an uppermost layer of the plurality of layers, by using an extreme ultraviolet (EUV) apparatus.

2. The overlay measurement method of claim 1, wherein n is 2, and
wherein performing the absolute measurement comprises:
performing the absolute measurement of positions of overlay marks of the first layer of the plurality of layers and a second layer of the plurality of layers, respectively.

3. The overlay measurement method of claim 1, wherein n is greater than or equal to 3,
wherein the exposure process is performed on an n−1th layer of the plurality of layers, which is directly below the nth layer, by using the DUV apparatus, and
wherein the absolute measurement is performed for positions of overlay marks of the first layer of the plurality of layers, the n−1th layer of the plurality of layers, and the nth layer of the plurality of layers.

4. The overlay measurement method of claim 1, wherein the exposure process is performed on the first layer by using an exposure apparatus including a transmissive photomask and using a wavelength that is greater than or equal to about 100 nm, and
wherein the exposure process is performed on the nth layer of the plurality of layers by using an exposure apparatus including a reflective photomask and using a wavelength that is less than or equal to about 20 nm.

5. The overlay measurement method of claim 1, further comprising performing, with respect to an overlay mark of a lower layer of the plurality of layers, a relative measurement of a position of an overlay mark of each of n−1 uppermost ones of the plurality of layers,
wherein in the relative measurement, both of a Vernier pattern of a current layer and a main pattern of the lower layer are measured, and
wherein in the absolute measurement, only one of the Vernier pattern and the main pattern is measured.

6. An overlay measurement method comprising:
performing, based on a fixed position, an absolute measurement of a position of a first overlay mark, which is formed on a first layer of a plurality of layers on a first semiconductor substrate by using a deep ultraviolet (DUV) apparatus;
first-feeding a result of the absolute measurement of the position of the first overlay mark back to the DUV apparatus;
performing an absolute measurement of a position of a second overlay mark, which is formed on an nth layer of the plurality of layers, which is an uppermost layer on the first semiconductor substrate, by using an extreme ultraviolet (EUV) apparatus; and
second-feeding a result of the absolute measurement of the position of the second overlay mark to the DUV apparatus.

7. The overlay measurement method of claim 6, wherein n is equal to or greater than 3, the method further comprising:
before the performing of the absolute measurement of the position of the second overlay mark, forming a third overlay mark on an n−1th layer of the plurality of layers, which is directly below the nth layer on the first semiconductor substrate, by using the DUV apparatus; and
performing an absolute measurement of the position of the third overlay mark of the n−1th layer.

8. The overlay measurement method of claim 7, wherein the second-feeding includes feeding an amount of overlay correction calculated by combining the result of the absolute measurement of the position of the first overlay mark, the result of the absolute measurement of the position of the second overlay mark, and a result of the absolute measurement of the position of the third overlay mark back to the DUV apparatus.

9. The overlay measurement method of claim 8, wherein the second-feeding further includes correcting an overlay component, an error of which three-dimensionally increases from a center toward both sides in a first direction perpendicular to a scan direction, in a combined exposure process of the DUV apparatus and the EUV apparatus, by changing an overlay input value of the DUV apparatus.

10. The overlay measurement method of claim 6, wherein the absolute measurement of the position of the second overlay mark is used to correct the overlay component, an error of which three-dimensionally increases from a center toward both sides in a first direction perpendicular to a scan direction, in a combined exposure process of the DUV apparatus and the EUV apparatus.

11. The overlay measurement method of claim 6, wherein, when n is 2, the absolute measurement is performed for positions of overlay marks of two layers of the plurality of layers, respectively, and, wherein, when n is greater than or equal to 3, an absolute measurement is performed for positions of overlay marks of at least three layers, respectively.

12. The overlay measurement method of claim 6, further comprising, before the performing of the absolute measurement of the position of the second overlay mark, performing a relative measurement of the position of an overlay mark of each of n−1 uppermost ones of the plurality of layers, with respect to an overlay mark of a lower layer, wherein in the relative measurement, both of a Vernier pattern of a current layer and a main pattern of the lower layer are measured, wherein in the absolute measurement of the position of the second overlay mark, only one of the Vernier pattern and the main pattern is measured, and wherein the fixed position is a position that is not changed and corresponds to an origin of an absolute coordinate in exposure processes by the DUV apparatus and the EUV apparatus.

13. The overlay measurement method of claim 6, wherein the first layer of the plurality of layers is exposed by using an exposure apparatus including a transmissive photomask and using a wavelength that is greater than or equal to about 100 nm, and wherein the nth layer of the plurality of layers is exposed by using an exposure apparatus including a reflective photomask and using a wavelength that is less than or equal to about 20 nm.

14. The overlay measurement method of claim 6, wherein the first overlay mark and the second overlay mark are diffraction-based overlay (DBO) marks, and wherein an overlay is measured by detecting a diffraction signal from the DBO marks.

15. A method of manufacturing a semiconductor device, the method comprising:

forming a first overlay mark on a first layer of a plurality of layers on a first semiconductor substrate by using a deep ultraviolet (DUV) apparatus;

performing an absolute measurement of a position of the first overlay mark, based on a fixed position;

first-feeding a result of the absolute measurement of the position of the first overlay mark back to the DUV apparatus;

forming a second overlay mark on an nth layer of the plurality of layers, which is the uppermost layer on the first semiconductor substrate, by using an extreme ultraviolet (EUV) apparatus;

performing an absolute measurement of a position of the second overlay mark; and second-feeding a result of the absolute measurement of the position of the second overlay mark back to the DUV apparatus.

16. The method of claim 15, wherein n is greater than or equal to 3, the method further comprising:

before the forming of the second overlay mark, forming a third overlay mark on an n−1th layer of the plurality of layers, which is directly below the nth layer on the first semiconductor substrate, by using the DUV apparatus; and performing an absolute measurement of a position of the third overlay mark of the n−1th layer.

17. The method of claim 16, wherein the second-feeding includes feeding an amount of overlay correction calculated by combining the result of the absolute measurement of the position of the first overlay mark, the result of the absolute measurement of the position of the second overlay mark, and a result of the absolute measurement of the position of the third overlay mark back to the DUV apparatus, and wherein the method further comprises, after the second-feeding, performing an exposure process on a second semiconductor substrate by using the DUV apparatus and the EUV apparatus.

18. The method of claim 17, wherein an overlay component, an error of which three-dimensionally increases from a center toward both sides in a first direction perpendicular to a scan direction, in the exposure process on the second semiconductor substrate, is corrected by changing an overlay input value of the DUV apparatus based on the amount of overlay correction.

19. The method of claim 15, wherein the performing of the absolute measurement of the position of the second overlay mark includes performing a relative measurement of the position the second overlay mark, wherein in the relative measurement, both of a Vernier pattern of a current layer and a main pattern of a lower layer are measured, and wherein in the absolute measurement, only one of the Vernier pattern and the main pattern is measured.

20. The method of claim 15, wherein the forming of the first overlay mark or the second overlay mark includes:

forming a photoresist on the first semiconductor substrate;

aligning the first semiconductor substrate;

exposing the first semiconductor substrate by using the DUV apparatus or the EUV apparatus, when a result of a measurement of the position of the first overlay mark or the position of the second overlay mark satisfies a predetermined criterion, feeding the result of the measurement back to the DUV apparatus or the EUV apparatus and performing a subsequent operation; and when the result of the measurement of the position of the first overlay mark or the position of the second overlay mark does not satisfy the predetermined criterion, changing an overlay input value of the DUV apparatus or the EUV apparatus and proceeding to the operation of forming the photoresist.

* * * * *